(12) United States Patent
Williamson

(10) Patent No.: US 7,749,683 B2
(45) Date of Patent: *Jul. 6, 2010

(54) PHOTOPOLYMERIZABLE COMPOSITION

(75) Inventor: Alexander Williamson, Mortsel (BE)

(73) Assignee: Agfa Graphics NV, Mortsel (BE)

( * ) Notice: Subject to any disclaimer, the term of this patent is extended or adjusted under 35 U.S.C. 154(b) by 380 days.

This patent is subject to a terminal disclaimer.

(21) Appl. No.: 11/718,637

(22) PCT Filed: Nov. 4, 2005

(86) PCT No.: PCT/EP2005/055745

§ 371 (c)(1),
(2), (4) Date: Jul. 25, 2007

(87) PCT Pub. No.: WO2006/048445

PCT Pub. Date: May 11, 2006

(65) Prior Publication Data

US 2009/0111052 A1    Apr. 30, 2009

Related U.S. Application Data

(60) Provisional application No. 60/630,101, filed on Nov. 22, 2004.

(30) Foreign Application Priority Data

Nov. 5, 2004    (EP) .................................. 04105557

(51) Int. Cl.
B41M 5/00       (2006.01)
G03F 1/00       (2006.01)
G03F 7/00       (2006.01)
G03F 7/26       (2006.01)

(52) U.S. Cl. .................... 430/302; 430/270.1; 430/342; 101/463.1

(58) Field of Classification Search .................. 430/302
See application file for complete search history.

(56) References Cited

U.S. PATENT DOCUMENTS

| 4,234,676 A | 11/1980 | Hein et al. |
| 4,436,806 A | 3/1984 | Rendulic et al. |
| 2003/0186165 A1* | 10/2003 | Gries et al. .............. 430/281.1 |
| 2004/0157140 A1* | 8/2004 | Kamata et al. .................. 430/7 |
| 2006/0024614 A1 | 2/2006 | Williamson |
| 2006/0069176 A1* | 3/2006 | Bowman et al. ................ 522/1 |
| 2007/0032564 A1 | 2/2007 | Callant et al. |

FOREIGN PATENT DOCUMENTS

| EP | 0 213 701 A1 | 3/1987 |
| EP | 0 924 569 A1 | 6/1999 |
| EP | 1 349 006 A1 | 10/2003 |
| WO | 03/072614 A2 | 9/2003 |

OTHER PUBLICATIONS

Official Communication for PCT Application No. PCT/EP2005/055745; mailed on Mar. 15, 2006.
Official Communication for PCT Application No. PCT/EP2005/055743.
Alexander Williamson; "Photopolymerizable Composition"; U.S. Appl. No. 11/718,635; filed May 4, 2007.

* cited by examiner

Primary Examiner—Cynthia H Kelly
Assistant Examiner—Chanceity N Robinson
(74) Attorney, Agent, or Firm—Keating & Bennett, LLP

(57) ABSTRACT

A composition that is photopolymerizable upon absorption of light and/or heat, the composition including a binder, a polymerizable compound, a sensitizer, and a photoinitiator, characterized in that the composition includes, with respect to its non-volatile compounds, at least about 0.01 wt. % of a polythiol compound, and wherein the composition when coated on a support has a sensitivity of about 150 µJ/cm$^2$ or higher, in combination with a high hardness.

12 Claims, No Drawings

PHOTOPOLYMERIZABLE COMPOSITION

BACKGROUND OF THE INVENTION

1. Field of the Invention

The present invention relates to a composition that is photopolymerizable upon absorption of light, the composition including a binder, a polymerizable compound, a sensitizer, and a photoinitiator.

The present invention also relates to a photopolymer printing plate precursor including the photopolymerizable composition and relates to a method of making a lithographic printing plate therewith.

2. Description of the Related Art

Compositions that are photopolymerizable upon absorption of light are well known in the art. Such compositions usually include a binder, a polymerizable compound, a sensitizer, and a photoinitiator, and are disclosed in, e.g., EP 1 349 006 A. From this document it is also known that radical chain transfer agents as described in EP 107 792 can be used to achieve a high sensitivity and that such radical chain transfer agents preferably are sulfur compounds like the monothiols 2-mercaptobenzothiazole, 2-mercaptobenzoxazole, or 2-mercaptobenzimidazole.

As there is an ongoing trend to expose photopolymerizable compositions with low power light sources like laser-LEDs, the sensitivity of the known compositions including monothiols is still unsatisfactory. Moreover, the optimization of photopolymerizable compositions and of printing plate precursors often is accompanied by a loss in sensitivity. This is, for example, the case when stabilizing the composition against environmental effects or when limiting the absorption spectra to allow for room light handling. Therefore, it is necessary to compensate for such a sensitivity loss.

Specific aliphatic polythiols for radiation curable compositions are known from, e.g., U.S. Pat. No. 4,120,721, wherein the composition forms a solid cured polythioether on exposure, but does not disclose a sensitizer plus photoinitiator system in combination with specific polythiols. The same is true for U.S. Pat. No. 3,993,549, wherein the composition is based on a particulate urea; FR 2,227,558; U.S. Pat. Nos. 3,753,720; 3,676,195; and 3,661,744.

Aliphatic thiols that have a branched structure in α- and/or β-position of the mercapto group are disclosed in WO 03/72614 and JP 2003-252918 A2 to be suitable for a high sensitivity of photosensitive compositions, wherein JP 2003-252918 A2 discloses such compounds in combination with organoboron complexes.

The use of organoboron complexes is also taught in EP 1 031 579, wherein such boron complexes are combined with a thiol-group-containing compound that preferably is selected from 5 specific compounds with one, three, or four thiol groups.

The polythiols are usually disclosed in the prior art to take part in the photocuring process and to react in combination with electron rich or electron poor polyenes by the thiol-ene mechanism. Therefore, they are commonly used in similar stoichiometric amounts as the polyenes and selected in view of the solid polythioether products that are formed by this reaction. Although the invention underlying, for example, WO 03/72614 is said to achieve a high sensitivity, it is disclosed on page 30 of this document that a super-high pressure mercury lamp, metal halide lamp, xenon lamp and the like is generally used as the light source and the example compositions only have a sensitivity of no higher than 10 mJ/cm$^2$. This demonstrates the unsatisfactory sensitivity of the compositions of the prior art. As for low power light sources, the sensitivity has to be significantly higher than 1 mJ/cm$^2$ and, therefore, has to be in the μJ/cm$^2$ region (a lower numerical value corresponds to a higher sensitivity, see below).

Therefore, there still is a need to find further thiol compounds and a photopolymerizable composition optimized for such compounds that result in a very high sensitivity because a broader range of compounds gives a better chance to optimize the photopolymerizable composition, in particular those including a binder, a polymerizable compound, a sensitizer, and a photoinitiator.

Optimization with respect to the properties and the costs as well is particularly important when using the photopolymerizable composition for the preparation of a lithographic printing plate precursor.

In addition, the known photopolymerizable compositions are still unsatisfactory in that they are not resistant enough after exposure and processing. In particular, the problem that known photopolymerizable compositions are not hard enough results, for example, when they are used in a lithographic printing plate precursor for a printing plate made from such a precursor that has a short printing lifetime. The printing lifetime is also called run-length on the press.

In lithographic printing, a so-called printing master such as a printing plate is mounted on a cylinder of the printing press. The master carries a lithographic image on its surface and a printed copy is obtained by applying ink to the image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e., ink-accepting, water-repelling) areas as well as hydrophilic (or oleophobic, i.e., water-accepting, ink-repelling) areas. In so-called "driographic" printing, the lithographic image consists of ink-accepting and ink-adhesive (ink-repelling) areas and during driographic printing, only ink is supplied to the master.

Printing masters are generally obtained by the so-called computer-to-film (CtF) method, wherein various pre-press steps such as typeface selection, scanning, color separation, screening, trapping, layout, and imposition are accomplished digitally and each color selection is transferred to graphic arts film using an image-setter. After processing, the film can be used as a mask for the exposure of an imaging material called a plate precursor, and after plate processing, a printing plate is obtained which can be used as a master. Since about 1995, the so-called 'computer-to-plate' (CtP) method has gained a lot of interest. This method, also called 'direct-to-plate', bypasses the creation of film because the digital document is transferred directly to a printing plate precursor by means of a so-called plate-setter. A printing plate precursor for CtP is often called a digital plate.

Digital plates can roughly be divided into three categories: (i) silver plates, which work according to the silver salt diffusion transfer mechanism, (ii) photopolymer plates which contain a photopolymerizable composition that hardens upon exposure to light, and (iii) thermal plates of which the imaging mechanism is triggered by heat or by light-to-heat conversion. Thermal plates are mainly sensitized for infrared lasers emitting at 830 nm or 1064 nm. Typical photopolymer plates are sensitized for visible light, mainly for exposure by an Ar laser (488 nm) or a FD-YAG laser (532 nm). The wide-scale availability of low cost blue or violet laser diodes, originally developed for data storage by means of DVD, has enabled the production of plate-setters operating at shorter wavelength. More specifically, semiconductor lasers emitting from 350 nm to 450 nm have been realized using an InGaN material.

Radicals are involved in the hardening reaction of the photopolymerizable composition of photopolymer plates and the hardening reaction is known to be adversely affected by oxygen. To reduce this problem it is known to provide the photosensitive coating with a protective coating, also called an oxygen barrier layer, protective overcoat, or overcoat layer.

After imaging (exposing) the photopolymer printing plate precursor, the plate is heated for a short time to high temperatures before the overcoat is washed off and the photolayer is developed. This heating step is hereinafter called a pre-heat step. During the pre-heat step, typical temperatures, when measured at the back of the plate, from about 90° C. to 150° C. are used for a short time, typically between 10 seconds and 1 minute. As the conditions of the pre-heat step vary with different types of processors and even for the same processor, a printing plate should exhibit consistent results irrespective of the pre-heat conditions, in particular, the temperature. The range of pre-heat conditions, wherein a printing plate exhibits consistent results, is called the pre-heat latitude of the plate.

SUMMARY OF THE INVENTION

In order to overcome the problems described above, preferred embodiments of the present invention provide a highly sensitive composition that is photopolymerizable on absorption of light and, in particular, a composition that is suitable to prepare a photopolymer printing plate precursor.

Another preferred embodiment of the present invention is a composition that, when coated on a support to obtain a lithographic printing plate precursor, is hard enough after imaging and processing to result in printing plate that has a long lifetime when used for printing.

Another preferred embodiment of the present invention is a photopolymer printing plate precursor including the composition of the preferred embodiment above. The printing plate precursor may be a flexographic or a lithographic printing plate precursor, the latter being highly preferred. Another preferred embodiment is a method of making a lithographic printing plate, wherein the printing plate precursor is imagewise exposed and thereafter developed. Preferred photopolymer printing plate precursors can be exposed with an energy density, measured on the surface of the plate, of approximately 100 µJ/cm² or less. Preferred embodiments of the photopolymerizable composition, of the printing plate precursor, and of the method of making a lithographic printing plate according to the present invention are described below.

DETAILED DESCRIPTION OF PREFERRED EMBODIMENTS

A preferred embodiment of the present invention relates to a composition that is photopolymerizable upon absorption of light, the composition including a binder, a polymerizable compound, a sensitizer, a photoinitiator, and a polythiol compound, characterized in that the composition includes, with respect to its total solid (dried; non-volatile) weight, at least 0.01 wt. % (weight %), preferably from about 0.01 wt. % to about 20 wt. %, in particular from about 0.1 wt. % to about 10 wt. %, and most preferred from about 0.1 wt. % to about 5 wt. % of the polythiol compound and that the polythiol compound is selected from one of the following formulae (IIIa) or (IIIb):

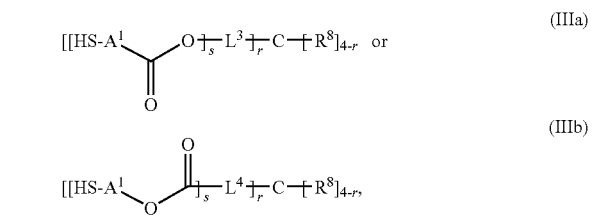

wherein
R⁸ mutually independent means H or a non-metal atom substituent;
A1, A2 mutually independent mean a linear or branched alkyl chain with at most 16 carbon atoms;
L³, L⁴ mutually independent mean linking groups or single bonds;
s means an integer from 1 to 100;
r means 1, 2, 3 or 4;
the product of s times r is at least 2;
the thiol groups of formulae (IIIa) or (IIIb) may also be present in their tautomeric thione form;
the composition when coated on a support preferably has a sensitivity of about 150 µJ/cm² or higher, more preferably about 100 µJ/cm² or higher, and more preferably about 60 µJ/cm² or higher; and
for polythioles of formula (IIIa), R⁸ means hydrogen, methyl, or ethyl; and r means 1, 2 or 3.

The sensitivity of the composition as defined in the context of preferred embodiments of the present invention is the sensitivity of a printing plate precursor obtained by coating the composition in a dry thickness of 1.5 g/m² on an electrochemically roughened and anodically oxidized aluminum sheet as described in the Examples in paragraph A, and coating on top of the so obtained photosensitive layer an overcoat layer as defined in Table 3 of the Examples in a dry thickness of 2.0 g/m². The sensitivity of the printing plate precursor is then measured by imaging through a 13-step exposure wedge with density increments of 0.15 per step using the imaging conditions described in the Examples. The sensitivity is then defined to be the minimum energy density that is necessary for a complete hardening of three wedge steps, wherein the coating is considered as being completely hardened when the density of the material is at least 97% of the density of a plate which has been exposed without a filter. So a higher number (numerical value) of the minimum energy density represents a lower sensitivity.

A linkage group is defined in the context of preferred embodiments of the present invention to be a single bond, or any substituted or unsubstituted polyvalent atom, or substituted or unsubstituted polyvalent atom group.

Preferably L³, L⁴ mutually independent mean alkylene, alkyleneoxy or polyglycerol; or alkylene chain containing acyloxy, ether, carbonate, thioether, hydroxy, phenyl, heterocyclic, amino, thiol, sulphonyl, amido, urethane, or urea functions.

For the preferred embodiments of the present invention, the following substitution and composition of polythiols (IIIa) and (IIIb) is particularly preferred.

Compounds of formula (IIIa) or (IIIb), wherein for r less then 4 at least one of the R⁸ substituents is different from hydrogen.

Compounds of formula (IIIa) or (IIIb), wherein R⁸ means hydrogen, methyl or ethyl; and/or s means 1; and/or L³ means alkylene; and/or L⁴ means alkylene; and/or A¹ and A² mean a linear alkylene chain containing up to 16 carbon atoms; and/or r means 2, 3 or 4, in particular 2.

The polythiols of the preferred embodiments of the present invention can be obtained by known synthetic methods.

Examples of preferred compounds of formulae (IIIa) and (IIIb) are given in the following.

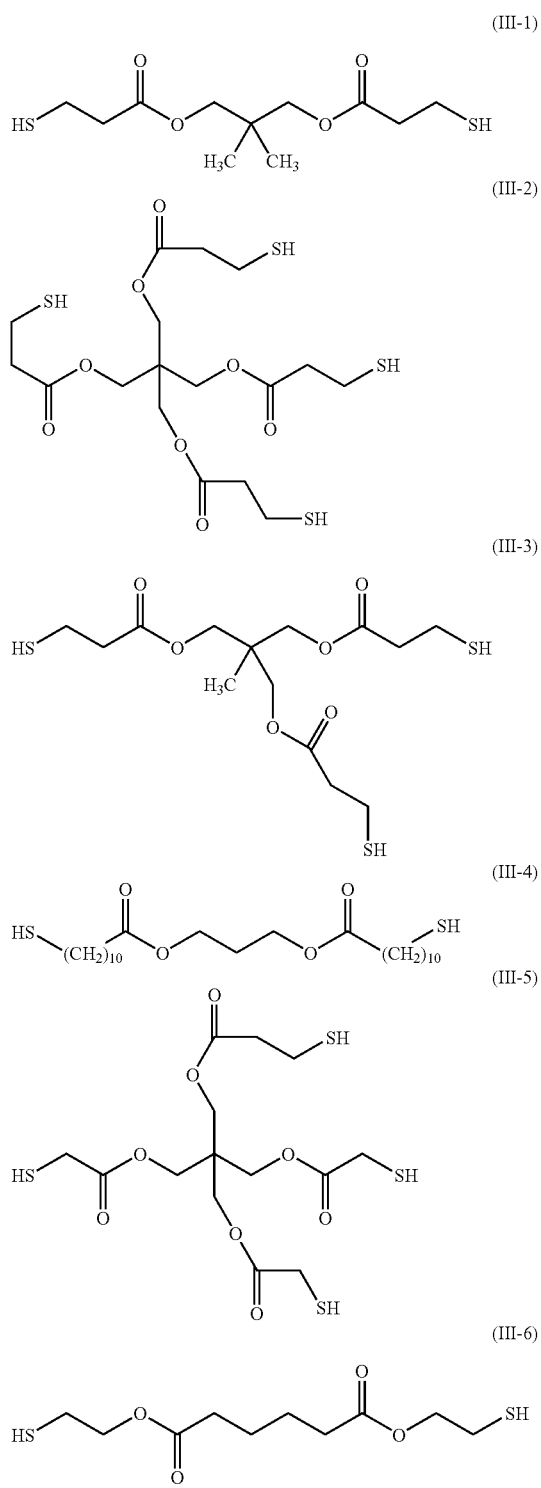

Surprisingly, it has been found that there is a positive interaction between the polythiols of the preferred embodiments of the present invention with a composition including a binder, a polymerizable compound, a sensitizer, and a photoinitiator. Only if these ingredients are present is it possible to achieve a high sensitivity and a high hardness, and the positive interaction is particularly pronounced if the polymerizable compound includes at least one of the following N-containing groups: primary, secondary, or tertiary amino, urethane, or urea. Although the underlying mechanism is not completely understood, it has to be different from the thiol-ene mechanism known from the prior art discussed above. This is because the polythiols of the preferred embodiments of the present invention are even effective at very low levels and need not be in stoichiometric relation to the polymerizable compounds of the composition. Even at such low levels, an exceptionally high sensitivity and hardness of the composition is achieved.

Moreover, the positive interaction is particularly pronounced if the photoinitiator is a hexaaryl-bisimidazole compound or a metallocene compound, in particular, a hexaaryl-bisimidazole compound. Although these photoinitiators are known to increase the sensitivity of known photopolymerizable compositions, the increase in sensitivity is higher in combination with the polythiols of the preferred embodiments of the present invention. Therefore, it is preferred for the composition that the photoinitiator is a hexaaryl-bisimidazole compound.

The composition can include a radical stabilizer that can be selected from known radical stabilizers to avoid unwanted polymerization. Compounds useful as radical stabilizers for the composition are also known as antioxidants or radical scavengers that are used as additives for, e.g., polymers. Preferably, the radical stabilizer is a compound selected from the group consisting of phenoles, organic phosphites, organic phosphonites, amines, hydroxylamines, lactones, hydrochinones, divalent sulfur compounds like thioethers and thioesters, metal complexants, wherein phenoles include mono-, di- and trihydroxyphenyl compounds, and in particular the radical stabilizer is a compound selected from the group consisting of hindered phenoles, O-alkylated hydrochinones, organic phosphites, organic phosphonites, aromatic amines, hindered amines, dialkyl hydroxylamines, benzofuranones, and dialkyl thiodipropionates.

The photosensitive coating of the preferred embodiments can include one, two, three or more different radical stabilizers. In the case where it contains more than one radical stabilizer, the compounds can belong to the same or different classes.

The radical stabilizers of the preferred embodiments are preferably incorporated in the photopolymerizable composition in an amount of about 0.01 to about 5 wt. %, in particular from about 0.015 to about 3 wt. %, with respect to the total weight of the non-volatile compounds of the photopolymerizable composition.

Although the composition of the preferred embodiments can include a radical stabilizer as disclosed above, it surprisingly also gives very good results without using such a compound. Therefore, it is also a preferred embodiment of the present invention wherein the photopolymerizable composition contains no radical stabilizer as defined above.

Although preferred embodiments of the present invention are also useful for compositions that are photopolymerizable upon absorption of red and/or infrared radiation, it is preferred for those compositions that are photopolymerizable upon absorption of light with a wavelength of about 600 nm or less, which includes the green, blue, and ultraviolet spectral range. A preferred sensitizing dye (sensitizer), when incorporated in the photopolymerizable composition, has an absorption wavelength ranging from about 300 nm to about 600 nm, preferably from about 350 nm to about 430 nm, and particularly preferred from about 360 nm to about 420 nm, and makes the photopolymer printing plate sensitive to light within these wavelength ranges.

In a preferred embodiment of the present invention, a sensitizer having a solubility in methyl ethyl ketone of at least about 15 g/kg, preferably from about 15 g/kg to about 250 g/kg, measured at 20° C. is preferably used.

The known sensitizing dyes can be used in the composition of the preferred embodiments of the present invention. Suitable classes include dialkylaminobenzene compounds like (S-Ia) and (S-Ib)

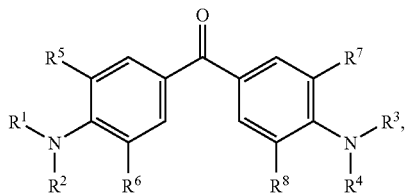

(S-Ia)

wherein each of $R^1$ to $R^4$, which are independent of one another, is an alkyl group having 1 to 6 carbon atoms ($C_{1-6}$ alkyl group), and each of $R^5$ to $R^8$ is a hydrogen atom or a $C_{1-6}$ alkyl group, provided that $R^1$ and $R^2$, $R^3$ and $R^4$, $R^1$ and $R^5$, $R^1$ and $R^6$, $R^3$ and $R^7$, or $R^4$ and $R^8$, may be bonded to each other to form a ring;

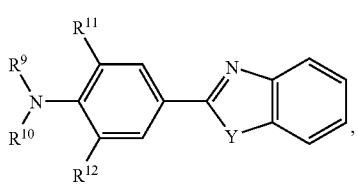

(S-Ib)

wherein each of $R^9$ and $R^{10}$, which are independent of each other, is a $C_{1-6}$ alkyl group, each of $R^{11}$ and $R^{12}$, which are independent of each other, is a hydrogen atom or a $C_{1-6}$ alkyl group, Y is a sulfur atom, an oxygen atom, dialkylmethylene or —N($R^{13}$)—, and $R^{13}$ is a hydrogen atom or a $C_{1-6}$ alkyl group, provided that $R^9$ and $R^{10}$, $R^9$ and $R^{11}$, or $R^{10}$ and $R^{12}$, may be bonded to each other to form a ring, as disclosed in EP 1 148 387 A1; compounds according to formula (S-II)

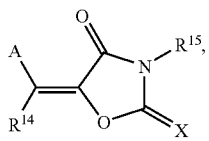

(S-II)

wherein A represents an optionally substituted aromatic ring or heterocyclclic ring, X represents an oxygen atom, a sulfur atom or —N($R^{16}$)—, $R^{14}$, $R^{15}$ and $R^{16}$ each independently represent a hydrogen atom or a monovalent nonmetallic atom group and A and $R^{14}$, or $R^{15}$ and $R^{16}$ can be linked together to form an aliphatic or an aromatic ring, as disclosed in EP 1 280 006 A2; 1,3-dihydro-1-oxo-2H-indene compounds as disclosed in EP 1 035 435 A2; the sensitizing dyes disclosed in EP 1 048 982 A1, EP 985 683 A1, EP 1 070 990 A1, and EP 1 091 247 A2; and/or an optical brightening agent.

To achieve a very high sensitivity, an optical brightening agent as a sensitizer is preferred. A typical optical brightener, also known as "fluorescent whitening agent", is a colorless to weakly colored organic compound that is capable of absorbing light having a wavelength in the range from about 300 nm to about 450 nm and of emitting the absorbed energy as fluorescent light having a wavelength in the range between about 400 nm and about 500 nm. A description of the physical principle and the chemistry of optical brighteners is given in Ullmann's Encyclopedia of Industrial Chemistry, Sixth Edition, Electronic Release, Wiley-VCH 1998. Basically, suitable optical brighteners contain π-electron systems including a carbocyclic or a heterocyclic nucleus. Suitable representatives of these compounds are, e.g., stilbenes, distyrylbenzenes, distyrylbiphenyls, divinylstilbenes, triazinylaminostilbenes, stilbenzyltriazoles, stilbenzylnaphthotriazoles, bis-triazolstilbenes, benzoxazoles, bisphenylbenzoxazoles, stilbenzylbenzoxazoles, bis-benzoxazoles, furans, benzofurans, bis-benzimidazoles, diphenylpyrazolines, diphenyloxadiazoles, coumarins, naphthalimides, xanthenes, carbostyrils, pyrenes, and 1,3,5-triazinyl-derivatives.

More specifically, optical brightening agents having a structure according to one of the following formulae are suitable as sensitizer for use in the composition of the preferred embodiments of the present invention:

(S-III)

(S-IV)

(S-V)

(S-VI)

(S-VII)

(S-VIII)
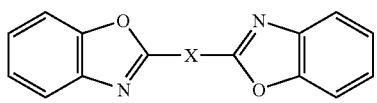

(S-IX)
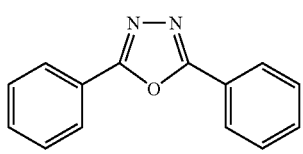

(S-X)
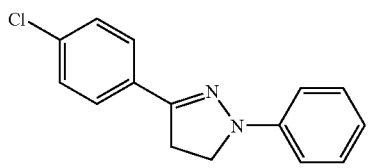

(S-XI)
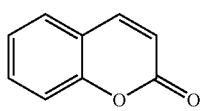

(S-XII)
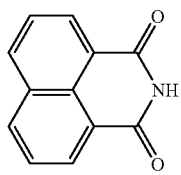

(S-XIII)
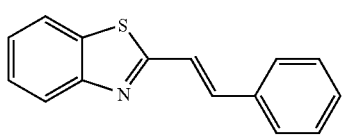

(S-XIV)
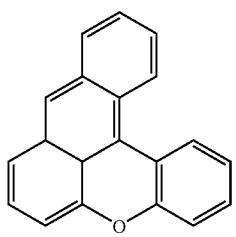

(S-XV)
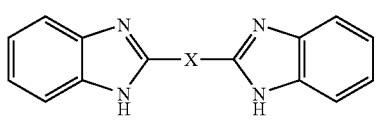

(S-XVI)
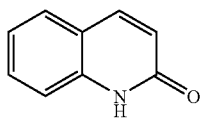

(S-XVII)
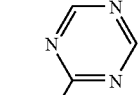
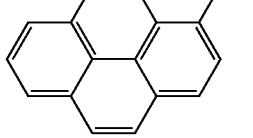

wherein X is one of the following groups, * denoting the

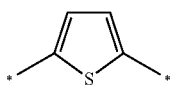

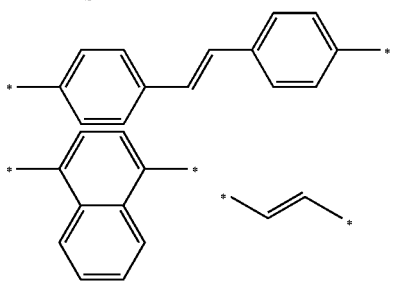

position of attachment in the above formulae: and wherein one or more of the nuclei in each of the above formulae (S-III) to (S-XVII) may be independently substituted by one or more groups selected from a non-metal atom group.

Especially suitable optical brighteners are compounds which are able to be dissolved in organic solvents. The optical brighteners can be used as a single compound or as a mixture of several materials. The overall amount of these compounds range from about 0.1 to about 10% by weight, preferably about 0.5 to about 8% by weight, with respect to the total weight of the non-volatile compounds in the photopolymerizable composition.

Highly preferred optical brighteners include compounds of formula (S-A) to (S-XII-A) and (S-XIV-A) to (S-XVII-A):

(S-III-A)
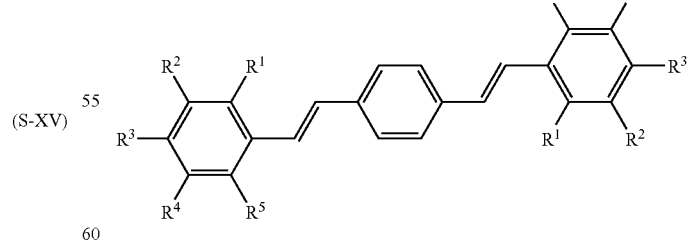

wherein
a) $R^1$ represents methyl, and $R^2$ to $R^5$ each represent H,
b) $R^2$ to $R^4$ represent methoxy, and $R^1$ and $R^5$ represent H,
c) $R^1$ represents CN, and $R^2$ to $R^5$ each represent H, or
d) $R^3$ represents CN, and $R^1$, $R^2$, $R^4$ and $R^5$ each represent H;

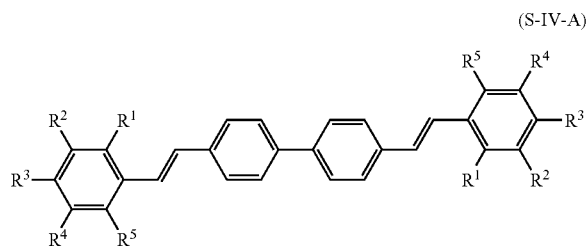

(S-IV-A)

wherein $R^1$ to $R^4$ each represent H, and $R^5$ represents methoxy;

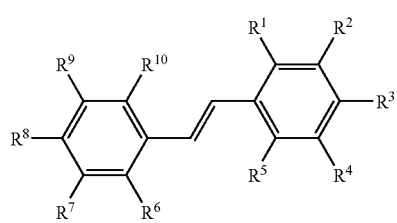

(S-V-A)

wherein
a) $R^1$ to $R^{10}$ each represent H,
b) $R^1$, $R^2$ and $R^4$ to $R^{10}$ each represent H, and $R^3$ represents methoxy, or
c) $R^1$, $R^2$, $R^4$ to $R^7$, $R^9$ and $R^{10}$ each represent H, and $R^3$ and $R^8$ each represent methoxy;

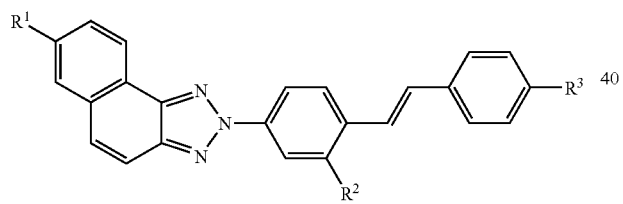

(S-VI-A)

wherein
a) $R^1$ and $R^3$ represent H, and $R^2$ represents phenylsulfonic acid or phenylsulfonic acid salts, or
b) $R^1$ represents H, $R^2$ represents CN and $R^3$ represents Cl;

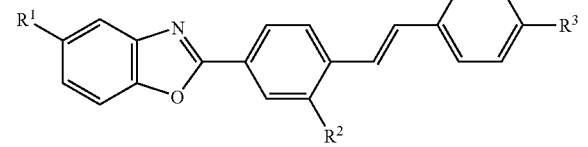

(S-VII-A)

wherein
a) $R^1$ represents t-butyl, $R^2$ represents H and $R^3$ represents phenyl,
b) $R^1$ represents methyl, $R^2$ represents H, and $R^3$ represents carboxymethyl, or
c) $R^1$ represents H, $R^2$ represents H, and $R^3$ represents 2-(4-methyl-oxa-3,3-diazole);

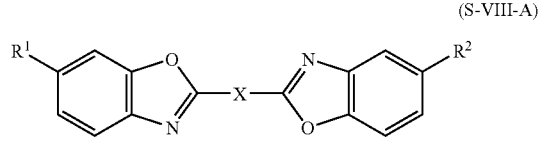

(S-VIII-A)

wherein
a) X represents 4,4'-stilbenediyl, and $R^1$ and $R^2$ each represent H,
b) X represents 2,5-thiophenediyl, and $R^1$ and $R^2$ each represent t-butyl,
c) X represents 1,4-naphthalenediyl, and $R^1$ and $R^2$ each represent H, or
d) X represents 1,1-ethenediyl, and $R^1$ and $R^2$ each represent methyl;

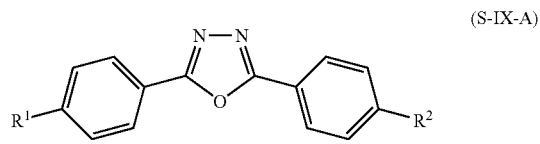

(S-IX-A)

wherein $R^1$ and $R^2$ each represent diethylamino;

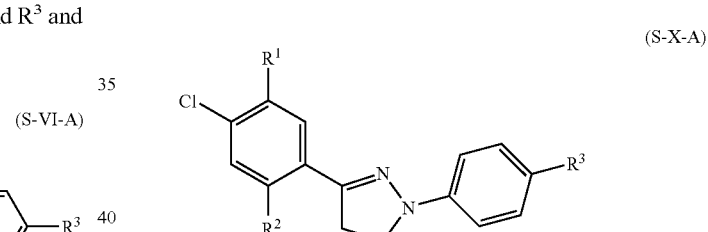

(S-X-A)

wherein
a) $R^1$ and $R^2$ each represent H, and $R^3$ represents $SO_2NH_2$,
b) $R^1$ and $R^2$ each represent H, and $R^3$ represents $SO_2CH_2CH_2OCH_2CH_2N(CH_3)_2$,
c) $R^1$ and $R^2$ each represent H, and $R^3$ represents $SO_2CH_2CH_2OCH(CH_3CH_2N(CH_3)_2$,
d) $R^1$ and $R^2$ each represent H, and $R^3$ represents $SO_2CH_3$, or
e) $R^1$ and $R^2$ each represent H, and $R^3$ represents $SO_2CH_2CH_2OH$;

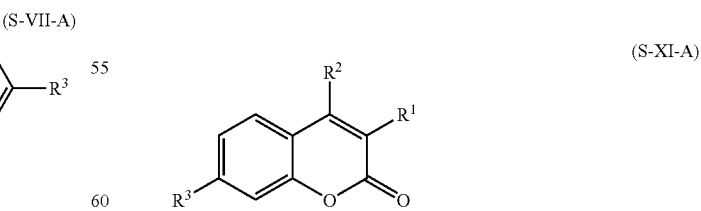

(S-XI-A)

wherein
a) $R^1$ represents H, $R^2$ represents Me, and $R^3$ represents diethylamino,
b) $R^1$ represents phenyl, $R^2$ represents H, and $R^3$ represents 2-N-naphthatriazolyl, c) R¹ represents H, R² represents methyl, and R³ represents OH,
d) R¹ represents phenyl, R² represents H, and R³ represents NH-(4,6-dichloro)-(1,3,5)-triazine, or
e) R¹ represents Ph, R² represents H, and R³ represents 1-(3-methylpyrazolinyl);

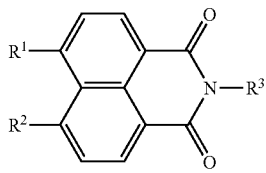
(S-XII-A)

wherein
a) R¹ represents H, R² represents methoxy, and R³ represents methyl; or
b) R¹ and R² each represent OEt, and R³ represents methyl;

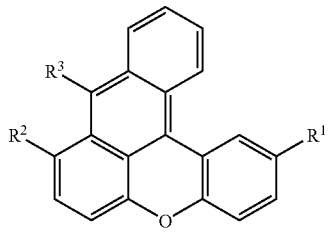
(S-XIV-A)

wherein
a) R¹ and R² each represent methyl, and R³ represents H or
b) R¹ and R² each represent methyl, and R³ represents carboxymethyl;

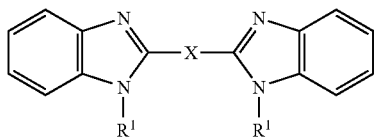
(S-XV-A)

wherein
a) X represents 1,2-ethenediyl, and R¹ represents Me, or
b) X represents 4,4'-stilbenediyl, and R¹ represents methyl;

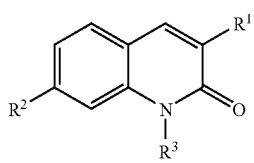
(S-XVI-A)

wherein R¹ represents Ph, R² represents diethylamino, and R³ represents ethyl; and

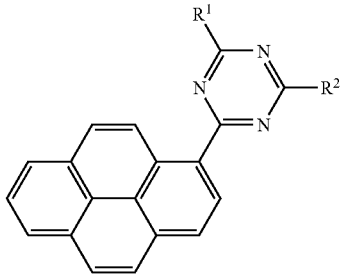
(S-XVII-A)

wherein R¹ and R² each represent methoxy.

From those sensitizers, the following compounds of formulae (S-III-B) and/or (S-IV-B) are particularly preferred:

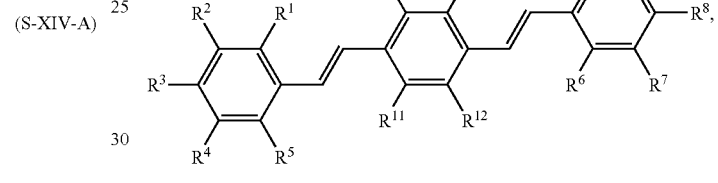
(S-III-B)

wherein
R¹ to R¹⁴ independently represent a hydrogen atom, an alkyl group, an alkoxy group, a cyano group, or a halogen atom, and at least one of R¹ to R¹⁰ represents an alkoxy group having more than 1 carbon atom;

(S-IV-B)

wherein
R¹⁵ to R³² independently represent a hydrogen atom, an alkyl group, an alkoxy group, a cyano group, or a halogen atom, and at least one of R¹⁵ to R²⁴ represents an alkoxy group having more than 1 carbon atom.

The alkyl and alkoxy groups of the preferred embodiments of the present invention can be optionally substituted and their substituent can be selected to adjust the solubility of the sensitizer and may be, for example, halogen, ester, ether, thioether, or hydroxy. The alkyl or alkoxy groups may be straight chain or cyclic, but a branched chain is preferred for the sensitizers of formulae (S-III-B) and (S-IV-B).

Particular advantages are achieved with sensitizers of formula (S-III-B), wherein R¹, R⁵, R⁶, R¹⁰, R¹¹, R¹², R¹³, and R¹⁴ independently represent a hydrogen atom, a fluorine atom, or a chlorine atom, in particular R¹, R⁵, R⁶, and R¹⁰ being a hydrogen atom; $R^2$ to $R^4$, $R^7$ to $R^9$, independently are alkoxy groups; and at least two of the alkoxy groups are branched and have from 3 to 15 carbon atoms. Especially preferred are sensitizers of formulae (S-III-B) as disclosed above, wherein $R^2$, $R^4$, $R^7$, $R^9$ independently represent a methoxy group and $R^3$ and $R^8$ independently are branched alkoxy groups having 3 to 15 carbon atoms.

Particular advantages are also achieved with sensitizers of formula (S-IV-B), wherein $R^{15}$, $R^{19}$, $R^{20}$, $R^{24}$, $R^{25}$ to $R^{32}$, independently represent a hydrogen atom, a fluorine atom, or a chlorine atom, in particular $R^{15}$, $R^{19}$, $R^{20}$, $R^{24}$ being a hydrogen atom; $R^{16}$ to $R^{18}$, $R^{21}$ to $R^{23}$, independently are alkoxy groups; and at least two of the alkoxy groups are branched and have from 3 to 15 carbon atoms. Especially preferred are sensitizers of formulae (IVa) as disclosed above, wherein $R^{16}$, $R^{18}$, $R^{21}$, $R^{23}$ independently represent a methoxy group and $R^{17}$ and $R^{22}$ independently are branched alkoxy groups having 3 to 15 carbon atoms.

The following structures are examples of preferred sensitizers and their solubility S is given in brackets as g sensitizer/ kg methyl ethyl ketone measured at 20° C.

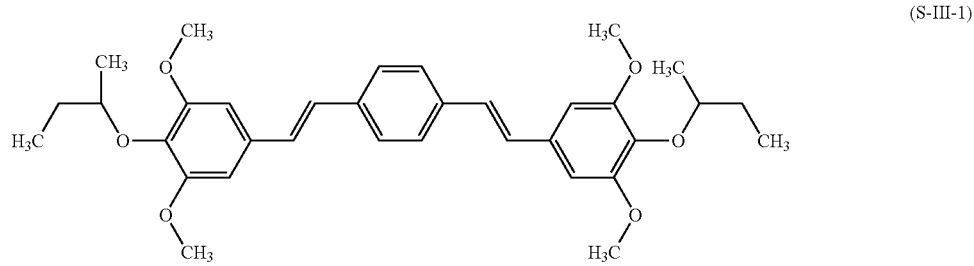

(S-III-1)

[S = 40]

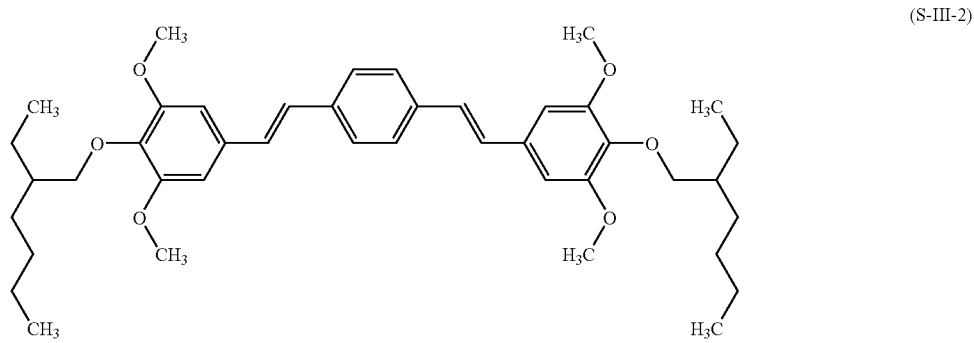

(S-III-2)

[S = 200]

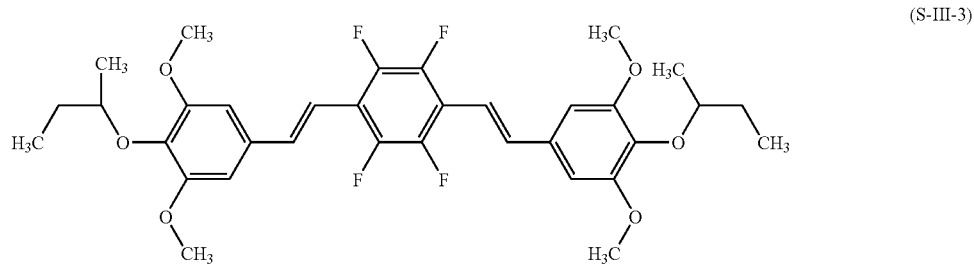

(S-III-3)

[S = 40]

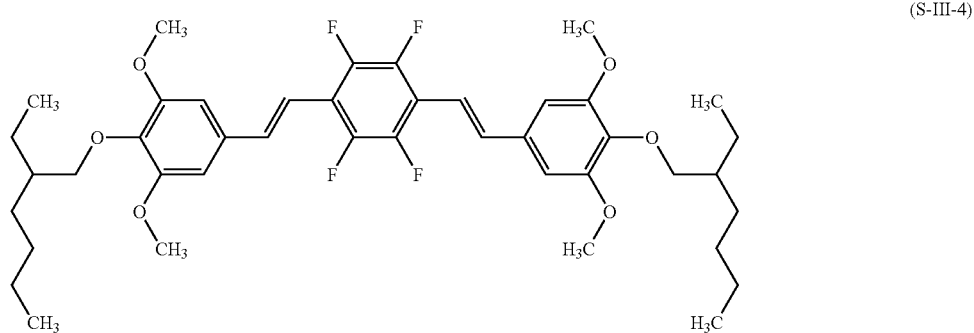

(S-III-4)

[S = 200]

-continued
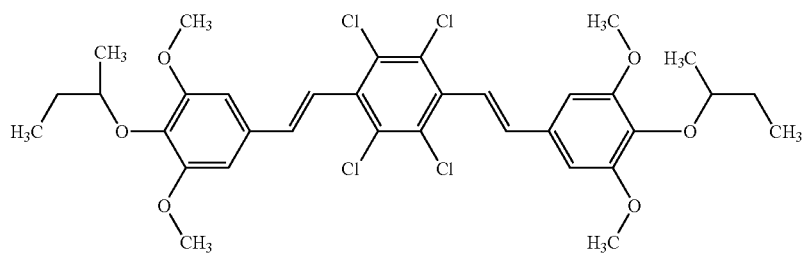
[S = 8]
(S-III-5)
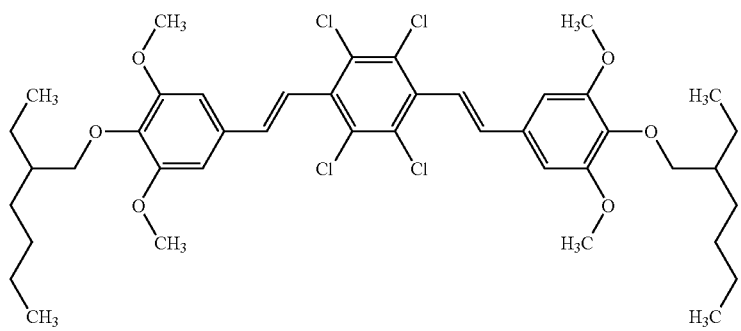
[S = 60]
(S-III-6)
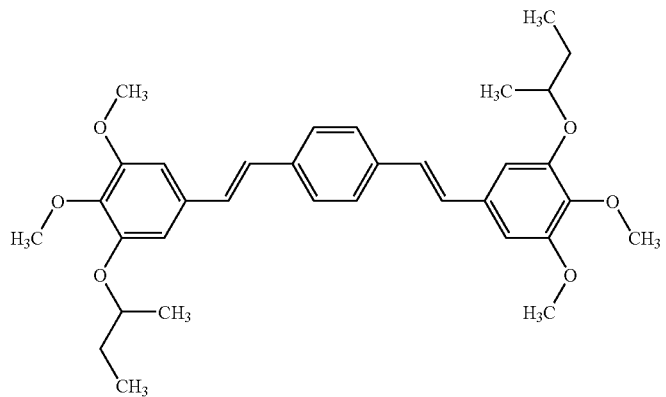
(S-III-7)
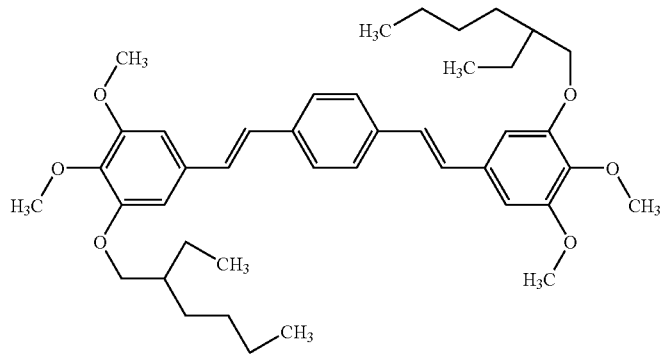
(S-III-8)

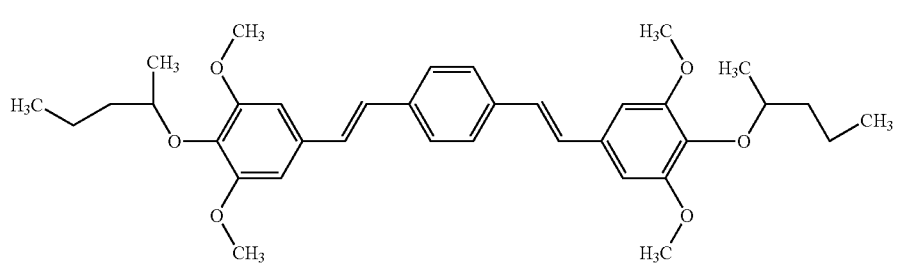

(S-III-9)

[S = 60]

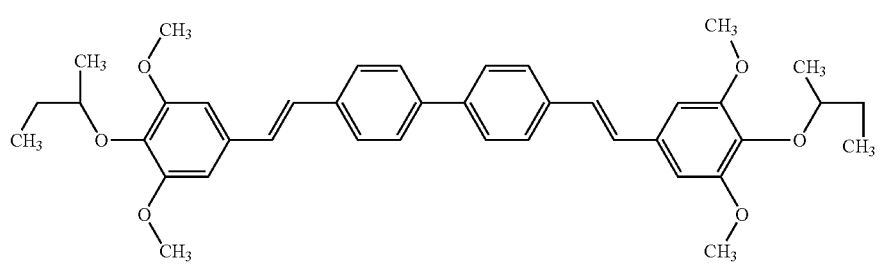

(S-IV-1)

[S = 80]

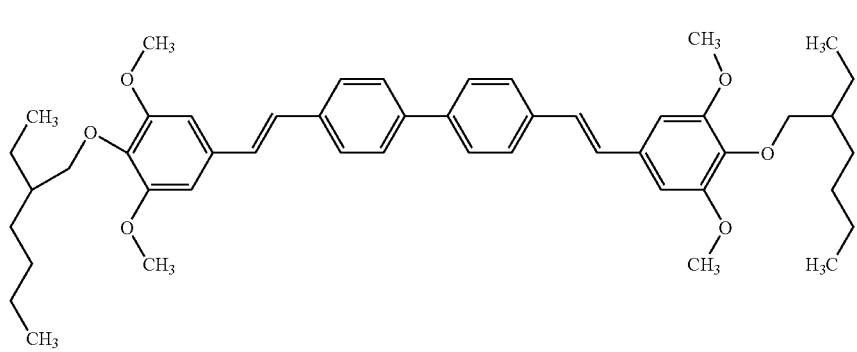

(S-IV-2)

[S = 150]

The sensitizers can be synthesized by known methods and the synthesis of the highly preferred sensitizers of formulae (S-III-B) and (S-IV-B) preferably can be done in analogy to the synthesis of sensitizer (S-III-1) as disclosed in the following.

Synthesis of Intermediate (C-3)

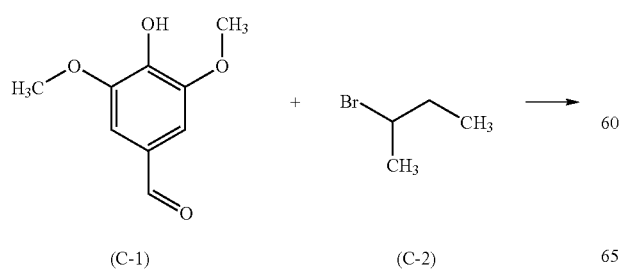

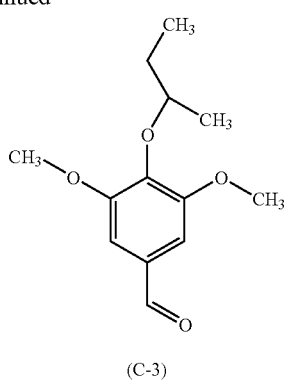

To a mixture of 8.365 kg (45.0 mol) syringaldehyde (C-1) and 1.494 kg (9.0 mol) potassium iodide is added 20.25 L sulfolane at room temperature. After heating up this mixture to 30° C. under nitrogen, 3.12 kg (47.25 mol) of KOH in water and 2.80 kg (20.25 mol) $K_2CO_3$ are added. After warming the reaction mixture to 75° C., 12.78 kg (90.0 mol) 2-bromo butane (C-2) is added over a period of 30 minutes. Heating at 75° C. is continued for 24 hours, followed by cooling to 25° C. Then 25 L Water is added and the reaction product is extracted with 18 L methyl t-butyl ether (MTBE). The organic phase is consecutively a) two times washed with 6.0 L of a 7.5 wt. % $K_2CO_3$ solution in water respectively, b) two times washed with 13.5 L of pure water respectively and finally, c) two times washed with 4.5 kg of a 20 wt. % NaCl solution in water respectively. The solvent (MTBE) is removed by distillation under reduced pressure of 50 mBar at 75° C. and thereby are obtained 7.845 kg (theoretical yield of 75%) of the crude intermediate (C-3) as a yellow oil, that is used in the synthesis of (S-III-1) without further purification.

Synthesis of Sensitizer (S-III-1)

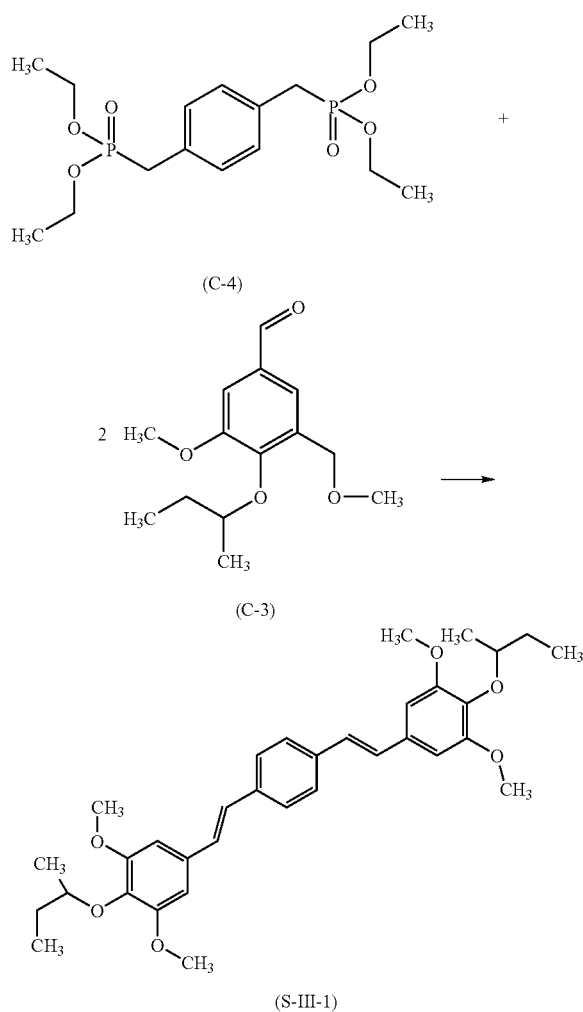

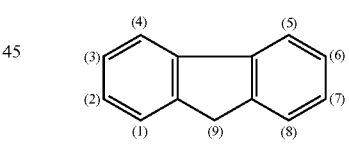

To a mixture of 9.63 kg (25.46 mol) p-xylylene-bis-phosphonate (C-4) and 12.13 kg (50.92 mol) of the crude intermediate (C-3) in 20 L THF, 4.70 kg (71.3 mol) of KOH is added at room temperature. After heating the stirred reaction mixture at reflux for 3.5 hours, the reaction product is precipitated by adding a mixture of 25.2 kg methanol and 9.9 kg water, followed by further cooling to 20° C. The crystalline product (S-III-1) is filtered off, washed with several portions of methanol/water on the filter and dried at 50° C. The yield is 9.05 kg (theoretical yield of 67%) of (S-III-1) having a melting point of 154° C.

A suitable synthesis for the p-xylylene-bis-phosphonate (C-4) is known from the literature, e.g., from B. P. Lugovkin and B. A. Arbuzov, Doklady Akademii Nauk SSSR (1948), 59, pages 1301 to 1304.

In a preferred embodiment of the present invention, the sensitizer is a fluorene compound that is conjugated via a double or triple bond with an aromatic or heteroaromatic group.

A preferred fluorene compound sensitizer for the present invention has at least two pi-substituents, that together include at least a total of 16 pi-electrons that are in conjugation with the pi-electrons of the fluorene ring system. To make possible the conjugation, the pi-substituents are bound to positions 1 to 8 of the fluorene ring system. Preferably, one of the two pi-substituents is bound to position 2 and the other to position 7 of the fluorene ring system and each of the two pi-substituents includes at least 8 pi-electrons that are in conjugation with the pi-electrons of the fluorene ring system.

The term "pi-electron" as used for the characterization of the sensitizers of various preferred embodiments of the present invention means a) electrons that are localized in orbitals perpendicular to the atom-atom bonds, and b) free electron pairs. For carbon, nitrogen, and oxygen atoms, pi-electrons usually are located in p-orbitals.

The terms "conjugated" or "in conjugation with" as used for the characterization of the sensitizers of preferred embodiments of the present invention, is commonly known for systems having alternating sequences of single and multiple bonds and/or atoms with a free electron pair and multiple bonds. The pi-electrons of, e.g., two double bonds separated by a single bond are said to be conjugated if the geometry of the molecule allows an overlap of the orbitals of the two double bonds so that their four pi-electrons are delocalized. In particular, the geometry is such that the molecular part that has a conjugated (delocalized) pi-electron system has a planar basic molecular skeleton.

The fluorene ring system and its numbering is demonstrated with the following formula:

In a preferred embodiment of the present invention, the sensitizer has a pi-substituent including a linking group with a carbon-carbon double or triple bond that links the fluorene ring system with an aryl or heteroaryl (hetaryl) group. The linking group can also include more than one conjugated double bond, as long as conjugation is possible from the pi-electrons of the fluorene ring system to the aryl or heteroaryl group of the pi-substituent. Preferably, the pi-substituent is selected from the groups -L-aryl or -L-heteroaryl, wherein L means an alkenylene or alkynylene group, and particularly preferred an ethenylene (vinylene) or ethynylene (—CC—) group. For the pi-substituents, preferred aryl groups are phenyl groups and preferred hetaryl groups are six ring heterocycles like pyridinyl groups and five ring heterocycles. Examples for preferred sensitizers according to preferred embodiments of the present invention are distyrylfluorene compounds, diheteroaryl vinylfluorene compounds, and diarylethynyl fluorene compounds.

In a particular preferred embodiment of the present invention, the sensitizer has a structure according to one of formulae (S-VIII), (S-XIX), or (S-XX):

(S-VIII)

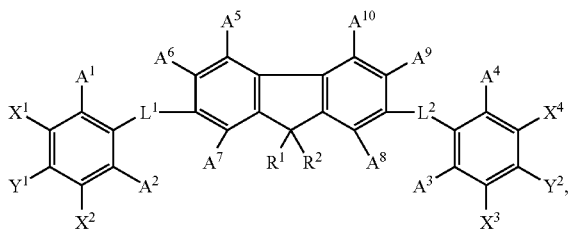

wherein $A^1$ to $A^{10}$, $X^1$ to $X^4$ and $Y^1$, $Y^2$ mutually independent mean a substituent selected from a non-metallic atom group;

$L^1$, $L^2$ mutually independent mean a linking group selected from —$CR^3$=$CR^4$— or ethynylene;

$R^1$ to $R^4$ mutually independent mean a substituent selected from a non-metallic atom group; and one or more pairs of the substituents can jointly mean the remaining atoms to form a ring;

(S-IX)

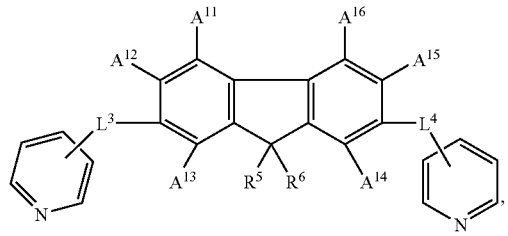

wherein $A^{11}$ to $A^{16}$ mutually independent mean a substituent selected from a non-metallic atom group;

$L^3$, $L^4$ mutually independent mean a linking group selected from —$CR^7$=$CR^8$— or ethynylene;

$R^5$ to $R^8$ mutually independent mean a substituent selected from a non-metallic atom group;

the pyridinyl groups are unsubstituted or substituted by one to four substituents selected from a non-metallic atom group;

L3, L4 are bond to a carbon atom of the pyridyl group; and one or more pairs of the substituents can jointly mean the remaining atoms to form a ring; or (S-XX)

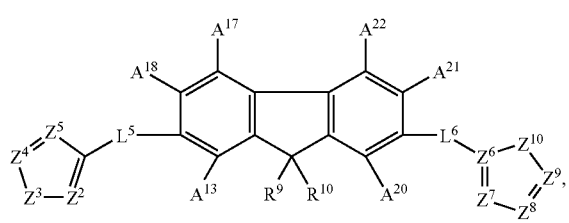

wherein $A^{17}$ to $A^{22}$ mutually independent mean a substituent selected from a non-metallic atom group;

$L^5$, $L^6$ mutually independent mean a linking group selected from —$CR^{11}$=$CR^{12}$— or ethynylene;

$R^9$ to $R^{12}$ mutually independent mean a substituent selected from a non-metallic atom group;

$Z^1$ to $Z^4$ and $Z^6$ to $Z^9$ mutually independent mean nitrogen or carbon atoms that can be unsubstituted or can be substituted by a substituent selected from a non-metallic atom group;

$Z^5$, $Z^{10}$ mutually independent mean O, S, C, $CR^{13}$, $CR^{14}R^{15}$, or $NR^{16}$;

$R^{13}$ to $R^{16}$ mutually independent mean a substituent selected from a non-metallic atom group; and one or more pairs of the substituents can jointly mean the remaining atoms to form a ring.

The one or more pairs of substituents that jointly can mean the remaining atoms to form a ring preferably are selected from $A^1$ with $X^1$; $X^1$ with $Y^1$; $Y^1$ with $X^2$; $X^2$ with $A^2$; $A^3$ with $X^3$; $X^3$ with $Y^2$; $Y^2$ with $X^4$; $X^4$ with $A^4$; $A^5$ with $A^6$; $R^1$ with $R^2$; $A^9$ with $A^{10}$; $A^1$, $A^2$, $A^6$ or $A^7$ with $R^3$ or $R^4$ of $L^1$; $A^3$, $A^4$, $A^8$ or $A^9$ with $R^3$ or $R^4$ of $L^2$; $A^{11}$ with $A^{12}$; $A^{15}$ with $A^{16}$; $A^{12}$ or $A^{13}$ with $R^7$ or $R^8$ of $L^3$; $A^{14}$ or $A^{15}$ with $R^7$ or $R^8$ of $L^4$; $A^{17}$ with $A^{18}$; $A^{21}$ with $A^{22}$; $A^{18}$ or $A^{19}$ with $R^{11}$ or $R^{12}$ of $L^5$; and $A^{20}$ or $A^{21}$ with $R^{11}$ or $R^{12}$ of $L^6$.

In a particular preferred embodiment of the present invention, the one or more pairs of substituents that jointly can mean the remaining atoms to from a ring are selected from $R^1$ with $R^2$; $A^1$, $A^2$, $A^6$ or $A^7$ with $R^3$ or $R^4$ of $L^1$; $A^3$, $A^4$, $A^8$ or $A^9$ with $R^3$ or $R^4$ of $L^2$; $A^{12}$ or $A^{13}$ with $R^7$ or $R^8$ of $L^3$; $A^{14}$ or $A^{15}$ with $R^7$ or $R^8$ of $L^4$; $A^{18}$ or $A^{19}$ with $R^{11}$ or $R^{12}$ of $L^5$; and $A^{20}$ or $A^{21}$ with $R^{11}$ or $R^{12}$ of $L^6$.

In a further preferred embodiment of the present invention the sensitizer has a structure according to one of formulae (S-XVIII), (S-XIX), or (S-XX); wherein $L^1$, $L^2$ mutually independent mean —$CR^3$=$CR^4$—; $L^3$, $L^4$ mutually independent mean —$CR^7$=$CR^8$—; and $L^5$, $L^6$ mutually independent mean —$CR^{11}$=$CR^{12}$—. In this preferred embodiment it is particularly preferred, when $R^3$, $R^4$, $R^7$, $R^8$, $R^{11}$, and $R^{12}$ mean a hydrogen atom.

In another preferred embodiment of the present invention, the sensitizer has a structure according to one of formulae (S-XVIII), (S-XIX) or (S-XX), wherein $A^1$ to $A^{22}$ mean hydrogen; and/or $X^1$ to $X^4$ mutually independent mean a substituent selected from hydrogen, alkoxy or alkylthio; and/or $Y^1$, $Y^2$ mutually independent mean a substituent selected from alkoxy or alkylthio; and/or $R^1$, $R^2$, $R^5$, $R^6$, $R^9$, $R^{10}$ mutually independent mean straight chain or branched alkyl; and/or $L^1$ to $L^6$ mean —CH=CH—.

Further advantages with respect to the sensitivity can be achieved with sensitizers of the following general formulae (S-XVIII-A) and/or (S-XVIII-B):

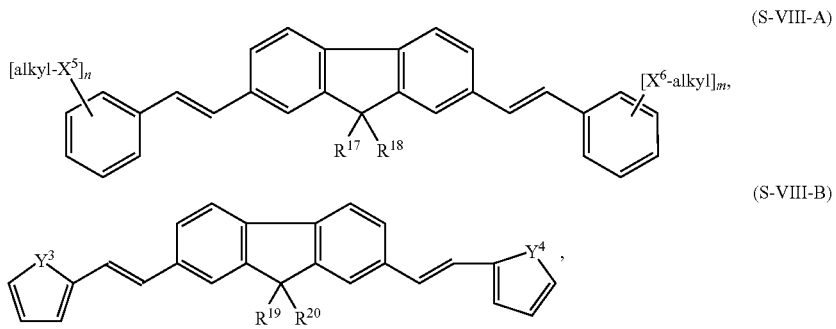

(S-VIII-A)

(S-VIII-B)

wherein the alkyl groups mutually independent mean an unsubstituted linear or branched alkyl group having 1 to 20 carbon atoms and preferably having 1 to 10 carbon atoms;

$X^5$ and $X^6$ mutually independent mean O or S, preferably O, n, m mutually independent mean an integer from 1 to 3, preferably 3;

$Y^3$, $Y^4$ mutually independent mean O, S, NH or N-alkyl, preferably O or S;

$R^{17}$ to $R^{20}$ mutually independent mean an unsubstituted linear or branched alkyl group having 1 to 20 carbon atoms and preferably having 1 to 10 carbon atoms; and the substituents alkyl-$X^5$ and alkyl-$X^6$ are bound at positions 3 and/or 4 and/or 5 of the phenyl rings respectively. In the case where n and/or m are 1, the single substituent is preferably bound at position 4 (para position) of the phenyl ring concerned.

Further advantages with respect to the sensitivity can be achieved with symmetrical sensitizers. A symmetrical sensitizer according to preferred embodiments of the present invention means a compound of formula (S-XVIII), wherein $A^1=A^4$, $A^2=A^3$, $A^6=A^9$, $A^5=A^{10}$, $A^7=A^8$, $X^1=X^4$, $X^2=X^3$, $Y^1=Y^2$, $R^1=R^2$, and $L^1=L^2$; a compound of formula (S-XIX), wherein $A^{11}=A^{16}$, $A^{12}=A^{15}$, $A^{13}=A^{14}$, $R^5=R^6$, $L^3=L^4$ and wherein the two pyridyl rings have the same substitution; or a compound of formula (S-XX), wherein $A^{17}=A^{22}$, $A^{18}=A^{21}$, $A^{19}=A^{20}$, $R^9=R^{10}$, $L^5=L^6$ and wherein the two 5 ring heterocycles have the same substitution.

Sensitizers of structures (S-XVIII) and (S-XX) are preferred over those of structure (S-XIX) and sensitizers of structure (S-XVIII) are particularly preferred.

The following structures are examples of preferred sensitizers of the present invention:

(S-XVIII-1)

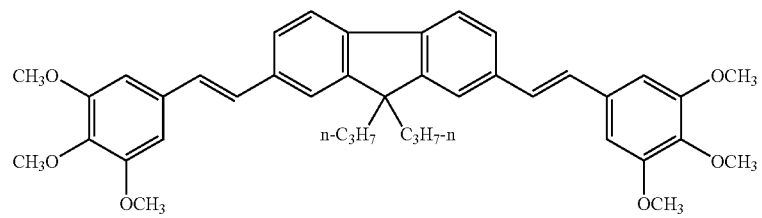

(S-XVIII-2):

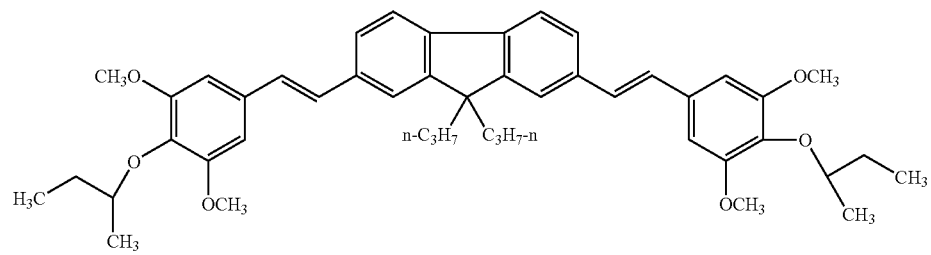

(S-XVIII-3)

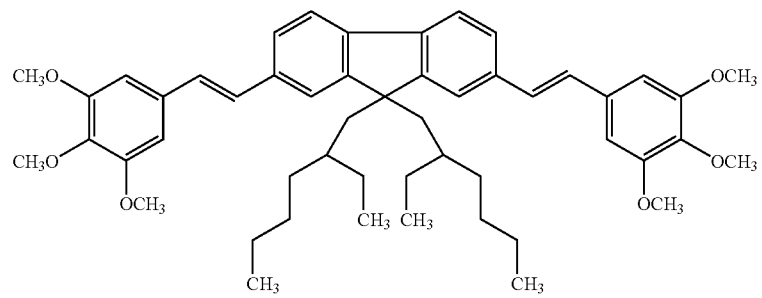

(S-XVIII-4):

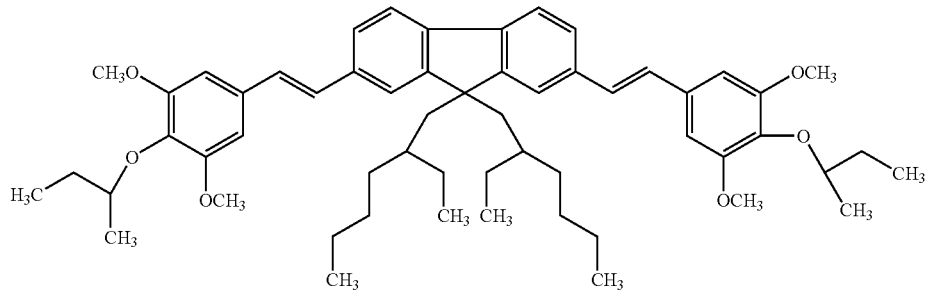

(S-XVIII-5)

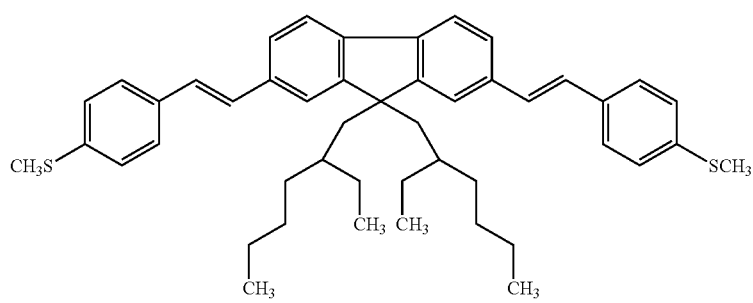

(S-XVIII-6)

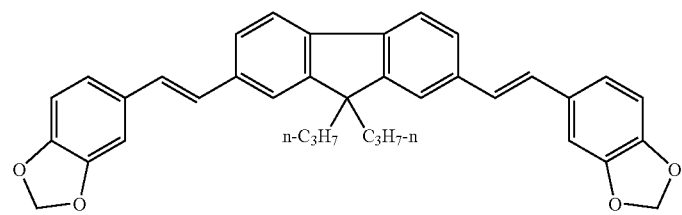

(S-XX-1)

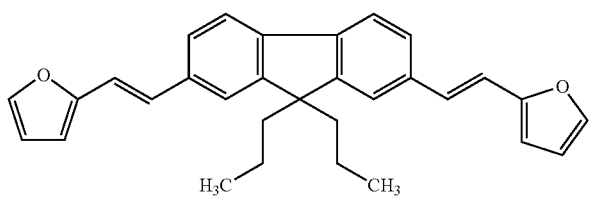

The sensitizer can be used as a single compound or as a mixture of compounds of formulae (S-XVIII) and/or (S-XIX) and/or (S-XX). The overall amount of these compounds ranges from about 0.1 to about 10% by weight, preferably about 0.5 to about 8% by weight with respect to the total weight of the non-volatile compounds in the composition. The sensitizer can also be combined with known sensitizers.

Preferred fluorene compound sensitizers useful for the present invention have a good solubility in common solvents. It has been found, that such sensitizers are particularly advantageous, that have a solubility of 0.5 g, in particular 1.5 g sensitizer per 100 mL methylethylketone or more.

The fluorene compound sensitizers can be synthesized by known methods, e.g., as described in J. M. Kauffman, G. Moyna, J. Org. Chem., 2003, 68, pp. 839-853 and particularly preferred the synthesis can be done in analogy to the synthesis of sensitizer (S-XVIII-2) as described in the following.

Synthesis of Sensitizer S-XVIII-2

Step 1: 9,9-Dipropylfluorene (2)

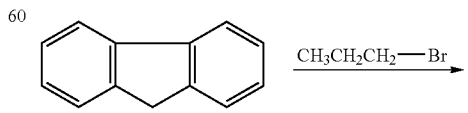

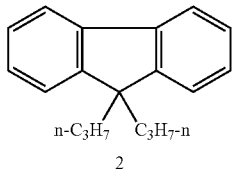

2

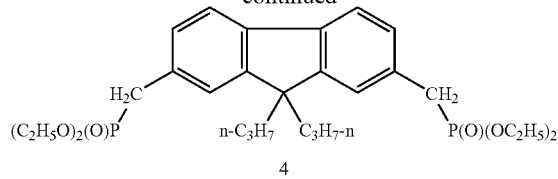

4

To a solution of fluorene (1) (41.5 g) in dimethylformamide (300 mL) at 20° C. was added sodium hydride (24.7 g) in portions. The red solution was stirred for 2 hours at 35° C. until no more gas was evolved. To this solution was added 1-bromopropane (62.7 g) drop-wise over 1 hour at 5° C. and then the mixture was stirred for 1 hour at 40° C.

The suspension was poured into ice-water (1.5 L) and the resultant oil was dissolved in methylene chloride (0.5 L). The organic phase was washed with water, dried over magnesium sulfate and the solvent was removed under reduced pressure. The residue was purified by vacuum distillation (122-125° C./0.5 mmHg) After cooling, 2 was obtained as a crystalline product (47.0 g, 74%).

Step 2: 2,7-Bis(bromomethyl)-9,9-dipropylfluorene (3)

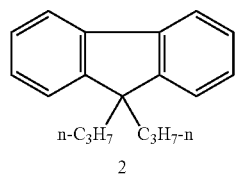

2 paraform, HBr

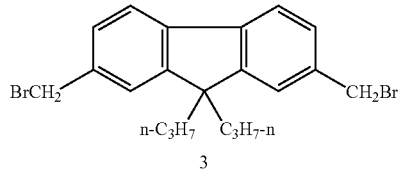

3

To a solution of 9,9-dipropylfluorene 2 (25.0 g) in acetic acid (50 mL) was added paraformaldehyde (paraform) (18.0 g) at 15° C. To the mixture was then added a solution of hydrogen bromide in acetic acid (250 mL, 30% w/w) over 0.5 hours, and the solution was stirred at 60° C. for 5 hours. The reaction mixture was poured into ice-water (1.0 L) and stirred for 0.5 hours. The precipitate was filtered off and purified by stirring in acetonitrile (200 mL) at 40° C., filtering and drying to give 3 as a yellow powder (33 g, 77%).

Step 3: 2,7-Bis(diethylphosphofonatomethyl)-9,9-dipropylfluorene (4)

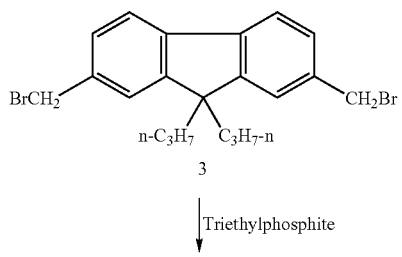

3

Triethylphosphite

A mixture of 2,7-Bis(bromomethyl)-9,9-dipropylfluorene (3) (33.0 g) and triethylphosphite (40 mL) was stirred for 3 hours at 150° C. Excess triethylphosphite was removed at reduced pressure at 100° C. and the resultant oil crystallized from hexane. After drying, 4 was obtained as a white powder (31.5 g, 67.5%).

Step 4: Sensitizer S-XVIII-2

4

↓

5

↓

S-VIII-2

To a solution of 2,7-Bis(diethylphosphofonatomethyl)-9,9-dipropylfluorene (4) (26.8 g) and 3,5-dimethoxy-4-(1-methylpropoxy)-benzaldehyde (5) (26.2 g) in tetrahydrofuran (200 mL) was added potassium hydroxide (8.4 g) and dimethylsulfoxide (5.0 mL). The suspension was stirred at 70° C. for 4 hours and then isopropanol (150 mL) was added. The solvent of the supernatant solution was removed at reduced pressure and the resultant oil was stirred in methanol (200 mL). The precipitate was filtered off and purified by stirring in boiling ethanol (200 mL) two times. After drying, S-XVIII-2 was obtained as a yellow powder (25.8 g, 72%).

The known photopolymerization initiators can be used in the composition of preferred embodiments of the present invention, but as disclosed above, in a preferred embodiment of the present invention the photopolymerizable composition can include a hexaaryl-bisimidazole (HABI; dimer of triarylimidazole) compound as a photopolymerization initiator alone or in combination with further photoinitiators.

A procedure for the preparation of hexaarylbisimidazoles is described in DE 1470 154 and their use in photopolymerizable compositions is documented in EP 24 629, EP 107 792; U.S. Pat. No. 4,410,621; EP 215 453; and DE 3 211 312. Preferred derivatives are, e.g., 2,4,5,2',4',5'-hexaphenylbisimidazole, 2,2'-bis(2-chlorophenyl)-4,5,4',5'-tetraphenylbisimidazole, 2,2'-bis(2-bromophenyl)-4,5,4',5'-tetraphenylbisimidazole, 2,2'-bis(2,4-dichlorophenyl)-4,5,4',5'-tetraphenylbisimidazole, 2,2'-bis(2-chlorophenyl)-4,5,4',5'-tetrakis(3-methoxyphenyl)bisimidazole, 2,2'-bis(2-chlorophenyl)-4,5,4',5'-tetrakis(3,4,5-trimethoxyphenyl)-bisimidazole, 2,5,2',5'-tetrakis(2-chlorophenyl)-4,4'-bis(3,4-dimethoxyphenyl)bisimidazole, 2,2'-bis(2,6-dichlorophenyl)-4,5,4',5'-tetraphenylbisimidazole, 2,2'-bis(2-nitrophenyl)-4,5,4',5'-tetraphenylbisimidazole, 2,2'-di-o-tolyl-4,5,4',5'-tetraphenylbisimidazole, 2,2'-bis(2-ethoxyphenyl)-4,5,4',5'-tetraphenylbisimidazole, and 2,2'-bis(2,6-difluorophenyl)-4,5,4',5'-tetraphenylbisimidazole.

The amount of the HABI photoinitiator typically ranges from about 0.01 to about 30% by weight, preferably from about 0.5 to about 20% by weight, relative to the total weight of the non volatile components of the photopolymerizable composition.

A very high sensitivity can be obtained by the combination of an optical brightener as a sensitizer and a hexaarylbisimidazole as a photoinitiator, sensitizers of formulae (S-III) and (S-IV) being particularly preferred.

Suitable classes of photoinitiators other than hexaarylbisimidazole compounds include aromatic ketones, aromatic onium salts, organic peroxides, thio compounds, ketooxime ester compounds, borate compounds, azinium compounds, metallocene compounds, active ester compounds and compounds having a carbon-halogen bond, but preferably the composition includes a non-boron including photopolymerization initiator and particularly preferred the photopolymerization initiator includes no boron compound. Many specific examples of photoinitiators suitable for preferred embodiments of the present invention can be found in EP-A 1 091 247.

Preferably, hexaarylbisimidazole compounds and/or metallocene compounds are used alone or in combination with other suitable photoinitiators, in particular with aromatic ketones, aromatic onium salts, organic peroxides, thio compounds, ketoxime ester compounds, azinium compounds, active ester compounds or compounds having a carbon halogen bond.

In a preferred embodiment of the present invention the hexaarylbisimidazole compounds make more than about 50 mol %, preferably at least about 80 mol %, and particularly preferred at least about 90 mol % of all the photoinitiators used in the photopolymerizable composition.

The non-metallic atom group preferably consists of a hydrogen atom or alkyl, alkenyl, alkynyl, aryl, heterocyclyl, hydroxy, carboxy, carbalkoxy, halogeno, alkoxy, aryloxy, heterocyclyloxy, alkylthio, arylthio, heterocyclylthio, alkylseleno, arylseleno, heterocyclylseleno, acyl, acyloxy, alkylsulfonyl, aminosulfonyl, acylamino, cyano, nitro, amino or mercapto groups, wherein heterocycle means a saturated, unsaturated or aromatic heterocycle and acyl means the remaining residue of an aliphatic, olefinic or aromatic carbon, carbaminic, sulfonic, amidosulfonic or phosphonic acid.

In a preferred embodiment of the present invention the non-metallic atom group consists of a hydrogen atom or alkyl, alkenyl, aryl, heterocyclyl, hydroxy, carboxy, carbalkoxy, halo-geno, alkoxy, aryloxy, heterocyclyloxy, alkylthio, arylthio, heterocyclylthio, acyl, acyloxy, acylamino, cyano, nitro, amino, or mercapto groups, wherein heterocycle has the same meaning as given above and acyl means the remaining residue of an aliphatic, olefinic or aromatic carbon, sulfonic, amidosulfonic or phosphonic acid.

Alkyl, alkylene, alkenyl, alkenylene, alkynyl and alkynylene groups can be linear (straight chain), branched or cyclic.

The alkyl, alkylene, alkenyl, alkenylene, alkynyl, alkynylene, aryl, heterocyclyl, alkoxy and alkylthio groups can be optionally substituted by a substituent selected from the non-metallic atom group and the substituents can be selected to adjust the solubility of the sensitizer and preferably may be halogeno, alkoxy, alkylthio, carbalkoxy, acyloxy or hydroxy.

A ring according to the present invention means a carbo- or heterocyle, that can be substituted by substituents selected from, e.g., the non-metallic atom group that can be saturated, unsaturated, or aromatic and that itself can be substituted by further rings. Preferably the ring is a 5 to 8 membered ring, and in particular a 5 or 6 membered ring.

The binder can be selected from a wide series of organic polymers. Compositions of different binders can also be used. Useful binders include, for example, chlorinated polyalkylenes, in particular chlorinated polyethylene and chlorinated polypropylene; poly(methacrylic acid) alkyl esters or alkenyl esters in particular poly(methyl(meth)acrylate), poly(ethyl (meth)acrylate), poly(butyl(meth)acrylate), poly(isobutyl (meth)acrylate), poly(hexyl(meth)acrylate), poly((2-ethylhexyl) (meth)acrylate) and poly(alkyl (meth)acrylate); copolymers of (meth)acrylic acid alkyl esters or alkenyl esters with other copolymerizable monomers, in particular with (meth)acrylonitrile, vinyl chloride, vinylidene chloride, styrene and/or butadiene; poly(vinyl chloride) (PVC); vinylchloride/(meth)acrylonitrile copolymers; poly(vinylidene chloride) (PVDC); vinylidene chloride/(meth)acrylonitrile copolymers; poly(vinyl acetate); poly(vinyl alcohol); poly (meth)acrylonitrile; (meth)acrylonitrile/styrene copolymers; (meth)acrylamide/alkyl(meth)acrylate copolymers; (meth) acrylonitrile/butadiene/styrene (ABS) terpolymers; polystyrene; poly(α-methylstyrene); polyamides; polyurethanes; polyesters; cellulose or cellulose compounds like methyl cellulose, ethyl cellulose, acetyl cellulose, hydroxy-($C_{1-4}$-alkyl) cellulose, carboxymethyl cellulose; poly(vinyl formal) and poly(vinyl butyral). Particularly suitable are binders that are insoluble in water, but on the other hand are soluble or at least swellable in aqueous-alkaline solutions. Further effective binders are polymers that are soluble in common organic coating solvents.

Particularly suitable are binders containing carboxyl groups, in particular, polymers or copolymers containing monomeric units of α,β-unsaturated carboxylic acids and/or monomeric units of α,β-unsaturated dicarboxylic acids, preferably acrylic acid, methacrylic acid, crotonic acid, vinylacetic acid, maleic acid or itaconic acid. By the term "copolymers" are to be understood in the context of the present invention polymers containing units of at least 2 different monomers, thus also terpolymers and higher mixed polymers. Particular useful examples of copolymers are those containing units of (meth)acrylic acid and units of alkyl (meth)acrylates, allyl (meth)acrylates and/or (meth)acrylonitrile as well as copolymers containing units of crotonic acid and units of alkyl (meth)acrylates and/or (meth)acrylonitrile and vinylacetic acid/alkyl(meth)acrylate copolymers. Also suitable are copolymers containing units of maleic anhydride or maleic acid monoalkyl esters. Among those are, for example, copolymers containing units of maleic anhydride and styrene, unsaturated ethers or esters or unsaturated aliphatic hydrocarbons and the esterification products obtained from such copolymers. Further suitable binders are products obtainable from the conversion of hydroxyl-containing polymers with intramolecular dicarboxylic anhydrides. Further useful binders are polymers in which groups with acid hydrogen atoms are present, some or all of which are converted with activated isocyanates. Examples of these polymers are products obtained by conversion of hydroxyl-containing polymers with aliphatic or aromatic sulfonyl isocyanates or phosphinic acid isocyanates. Also suitable are polymers with aliphatic or aromatic hydroxyl groups, for example copolymers containing units of hydroxyalkyl(meth)acrylates, allyl alcohol, hydroxystyrene or vinyl alcohol, as well as epoxy resins, provided they carry a sufficient number of free OH groups.

The organic polymers used as binders have a typical mean molecular weight Mw between 600 and 200,000, preferably between 1,000 and 100,000. Preference is further given to polymers having an acid number between 10 to 250, preferably 20 to 200, or a hydroxyl number between 50 and 750, preferably between 100 and 500. The amount of binder(s) generally ranges from about 10 to about 90% by weight, preferably about 20 to about 80% by weight, relative to the total weight of the non-volatile components of the composition.

The polymerizable compound can be selected from a wide series of photo-oxidizable compounds, in particular from those that include at least one of the following N-containing groups: primary, secondary or tertiary amino, urethane or urea. From the compounds including at least one primary, secondary or tertiary amino group, those including at least a tertiary amino group are preferred. Radically polymerizable compounds containing at least one urethane and/or urea group and/or a tertiary amino group are particularly preferred. By the term "urea group" is to be understood in the context of preferred embodiments of the present invention a group of the formula >N—CO—N<, wherein the valences on the nitrogen atoms are saturated by hydrogen atoms and hydrocarbon radicals (with the proviso that not more than one valence on either of the two nitrogen atoms is saturated by one hydrogen atom). However, it is also possible for one valence on one nitrogen atom to be bonded to a carbamoyl (—CO—NH—) group, producing a biuret structure.

Also suitable are compounds containing a photo-oxidizable amino, urea or thio group, which may be also be a constituent of a heterocyclic ring. Compounds containing photo-oxidizable enol groups can also be used. Specific examples of photo-oxidizable groups are triethanolamino, triphenylamino, thiourea, imidazole, oxazole, thiazole, acetylacetonyl, N-phenylglycine and ascorbic acid groups. Particularly suitable compounds are monomers containing photo-oxidizable groups corresponding to the following formula (XVIII):

$$R_{(m-n)}Q[(-CH_2-CR^1R^2-O)_a-CO-NH-(X^1-NH-CO-O)_b-X^2-(O-CO-CR^3=CH_2)_c]_n \quad (XVIII)$$

wherein

R represents an alkyl group having 2 to 8 carbon atoms ($(C_2-C_8)$ alkyl group), a $(C_2-C_8)$ hydroxyalkyl group or a $(C_6-C_{14})$ aryl group;

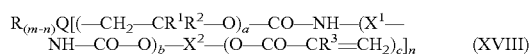

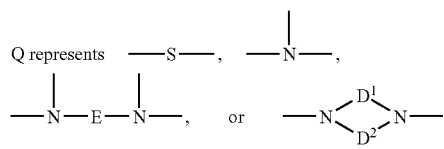

wherein

E represents a divalent saturated hydrocarbon group of 2 to 12 carbon atoms, a divalent 5- to 7-membered, saturated iso- or heterocyclic group, which may contain up to 2 nitrogen, oxygen and/or sulfur atoms in the ring, a divalent aromatic mono- or bicyclic isocyclic group of 6 to 12 carbon atoms or a divalent 5- or 6-membered aromatic heterocyclic group; and $D^1$ and $D^2$ independently represent a saturated hydrocarbon group of 1 to 5 carbon atoms;

$R^1$ and $R^2$ independently represent a hydrogen atom, an alkyl or alkoxyalkyl group;

$R^3$ represents a hydrogen atom, a methyl or ethyl group;

$X^1$ represents a straight-chained or branched saturated hydrocarbon group of 1 to 12 carbon atoms;

$X^2$ represents a (c+1)-valent hydrocarbon group in which up to 5 methylene groups may have been replaced by oxygen atoms;

a is an integer from 0 to 4;

b is 0 or 1;

c is an integer from 1 to 3;

m is an integer from 2 to 4; and n is an integer from 1 to m.

Compounds of this nature and processes for their preparation are described in EP 287 818. If a compound of general formula (XVIII) includes several radicals R or several radicals according to the structure indicated between square brackets, i.e., if (n−m)>1 and n>1, these radicals can be identical or different from one another. Compounds according to formula (XVIII) wherein n=m are particularly preferred. In this case, all radicals contain polymerizable groups. Preferably, the index a is 1; if several radicals are present, a cannot be 0 in more than one radical. If R is an alkyl or hydroxyalkyl group, R generally contains 2 to 6, particularly 2 to 4 carbon atoms. Aryl radicals R are in general mononuclear or binuclear, preferably however mononuclear, and may be substituted with $(C_1-C_5)$ alkyl or $(C_1-C_5)$ alkoxy groups. If $R^1$ and $R^2$ are alkyl or alkoxy groups, they preferably contain 1 to 5 carbon atoms. $R^3$ is preferably a hydrogen atom or a methyl group. $X^1$ is preferably a straight-chained or branched aliphatic and/or cycloaliphatic radical of preferably 4 to 10 carbon atoms. In a preferred embodiment, $X^2$ contains 2 to 15 carbon atoms and is in particular a saturated, straight-chained or branched aliphatic and/or cycloaliphatic radical containing this amount of carbon atoms. Up to 5 methylene groups in these radicals may have been replaced by oxygen atoms; in the case of $X^2$ being composed of pure carbon chains, the radical generally has 2 to 12 carbon atoms, preferably 2 to 6 carbon atoms. $X^2$ can also be a cycloaliphatic group of 5 to 10 carbon atoms, in particular a cyclohexane diyl group. The saturated heterocyclic ring formed by $D^1$, $D^2$ and both nitrogen atoms generally has 5 to 10 ring members in particular 6 ring members. In the latter case the heterocyclic ring is preferably a piperazine and the radical derived therefrom a piperazine-1,4-diyl radical. In a preferred embodiment, radical E is an alkane diyl group which normally contains about 2 to 6 carbon atoms. Preferably the divalent 5- to 7-membered, saturated, isocyclic group E is a cyclohexane diyl group, in particular a cyclohexane-1,4-diyl group. The divalent, isocyclic, aromatic group E is preferably an ortho-, meta- or para-phenylene group. The divalent 5- or 6-membered aromatic heterocyclic group E, finally, contains preferably nitrogen and/or sulphur atoms in the heterocyclic ring. c is preferably 1, i.e., each radical in the square bracket generally contains only one polymerizable group, in particular only one (meth)acryloyloxy-group.

The compounds of formula (XVIII) wherein b=1, which accordingly contain two urethane groups in each of the radicals indicated in the square brackets, can be produced in a known way by conversion of acrylic esters or alkacrylic esters which contain free hydroxyl groups with equimolar amounts of diisocyanates. Excess isocyanate groups are then, for example, reacted with tris(hydroxyalkyl)amines, N,N'-bis (hydroxyalkyl)piperazines or N,N,N',N'-tetrakis(hydroxyalkyl)alkylenediamines, in each of which individual hydroxyalkyl groups may have been replaced by alkyl or aryl groups R. If a=0, the result is a urea grouping. Examples of the hydroxyalkylamine starting materials are diethanolamine, triethanolamine, tris(2-hydroxypropyl)amine, tris(2-hydroxybutyl)amine and alkyl-bis-hydroxyalkylamines.

Examples of suitable diisocyanates are hexamethylene diisocyanate, 2,2,4-trimethylhexamethylene diisocyanate, 1,4-cyclohexylene diisocyanate (=1,4-diisocyanatocyclohexane), and 1,1,3-trimethyl-3-isocyanatomethyl-5-isocyanatocyclohexane. The hydroxy-containing esters used are preferably hydroxyethyl(meth)acrylate, hydroxypropyl(meth)acrylate, and hydroxyisopropyl (meth)acrylate.

The polymerizable compounds of formula (XVIII) wherein b=0 are prepared converting the above-described hydroxyalkylamino compounds with isocyanate-containing acrylic or alkacrylic esters. A preferred isocyanate-containing ester is isocyanoto-ethyl(meth)acrylate.

Further polymerizable compounds including photooxidizable groups suitable for the purpose of the invention are compounds according to the following formula (XIX):

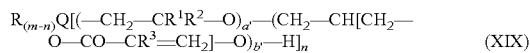

(XIX)

wherein a' and b' independently represent integers from 1 to 4 and Q, $R^1$, $R^2$, $R^3$, n, and m have the same meaning as above and Q can also be a group of the formula >N—E'—N< wherein the radical E' corresponds to the following formula (XX):

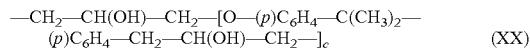

(XX)

wherein c has the same meaning as in formula (I) and $(p)C_6H_4$ represents para-phenylene.

The compounds of formula (XIX) can be prepared analogously to those of formula (XVIII), except that the conversion products of hydroxyalkyl acrylates or alkacrylates and diisocyanates are replaced by the corresponding acrylic and alkacrylic glycide esters. Compounds of formula (XX) and processes to their preparation are disclosed in EP 316 706.

Further useful polymerizable compounds containing photooxidizable groups are acrylic and alkacrylic esters of the following formula (XXI):

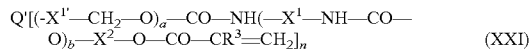

(XXI)

wherein

Q' represents 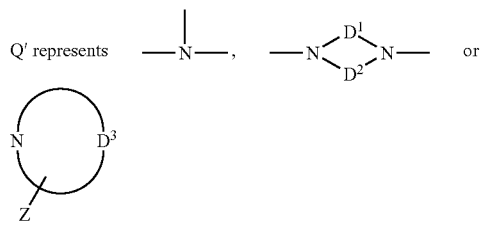

wherein $D^1$ and $D^2$ independently represent a saturated hydrocarbon group of 1 to 5 carbon atoms and $D^3$ represents a saturated hydrocarbon group of 4 to 8 carbon atoms, which together with the nitrogen atom forms a 5- or 6-membered heterocyclic ring;

$X^{1'}$ represents —$C_iH_{2i}$— or

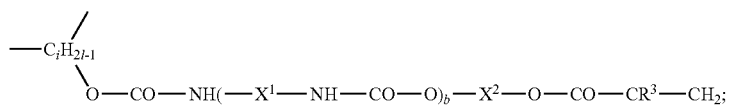

Z represents a hydrogen atom or a radical of the following formula:

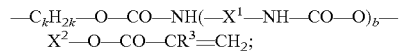

i, k independently represent integers from 1 to 12;

n' represents an integer from 1 to 3;

a is 0 or 1; provided that a is 0 in at least one of the radicals bonded to Q;

$X^1$, $R^3$, a and b have the same meaning as given in the above formula (VIII); and $X^2$ represents a divalent hydrocarbon group in which up to 5 methylene groups may be replaced by oxygen atoms.

In formula (XXI) index a is preferably 0 or 1 and i preferably represents a number between 2 and 10. Preferred radicals Q are piperazine-1,4-diyl ($D^1=D^2=CH_2—CR_2$), piperidine-1-yl ($D^3=(CH_2)_5$, Z=H) and 2-(2-hydroxyethyl)-piperidine-1-yl ($D^3=(CH_2)_5$, Z=$CH_2CH_2OH$).

Of the compounds of formula (XXI), those which apart from a urea group contain at least one urethane group are preferred. Here again, by the term "urea group" is to be understood the group of formula >N—CO—N< already mentioned above. Compounds of formula (XXI) and processes for their preparation are disclosed in EP 355 387.

Also suitable polymerizable compounds are reaction products of mono- or diisocyanates with multifunctional alcohols, in which the hydroxy groups are partly or completely esterified with (meth)acrylic acid. Preferred compounds are materials, which are synthesized by the reaction of hydroxyalkyl-(meth)acrylates with diisocyanates. Such compounds are basically known and, for instance, described in DE 28 22 190 and DE 20 64 079.

The amount of polymerizable compound including photooxidizable groups generally ranges from about 5 to about 75% by weight, preferably from about 10 to about 65% by weight, relative to the total weight of the non volatile compounds of the photopolymerizable composition.

Moreover, the composition can contain polyfunctional (meth)acrylate or alkyl(meth)acrylate compounds as crosslinking agents. Such compounds contain more than 2, preferably between 3 and 6 (meth)acrylate and/or alkyl(meth) acrylate groups and include in particular (meth)acrylates of saturated aliphatic or alicyclic trivalent or polyvalent alcohols such as trimethylol ethane, trimethylol propane, pentaerythritol or dipentaerythritol.

The total amount of polymerizable compounds generally ranges from about 10 to about 90% by weight, preferably from about 20 to about 80% by weight, relative to the total weight of the non volatile components of the photopolymerizable composition.

The following specific example is a preferred polymerizable compound:

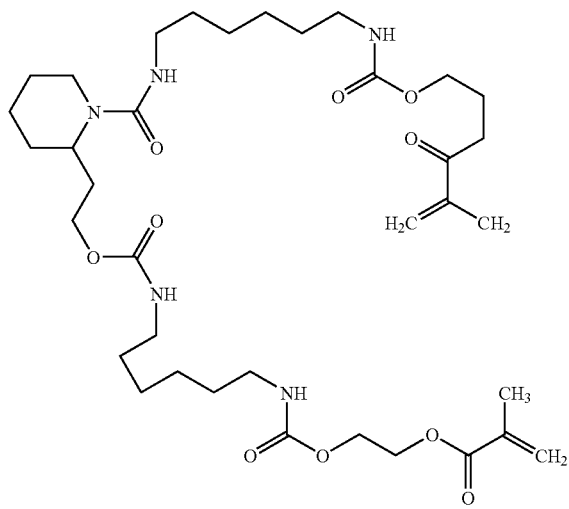

It can be useful to combine the polythiol compounds with known sulfur containing compounds such as those described in EP 107 792, in particular with thiols like, e.g., 2-mercaptobenzothiazole, 2-mercaptobenzoxazole or 2-mercaptobenzimidazole. The amount of such additional sulfur containing compounds generally ranges from about 0.01 to about 10% by weight, preferably from about 0.1 to about 2% by weight, relative to the total weight of the non volatile components of the photopolymerizable composition.

Optionally, pigments, e.g., predispersed phthalocyanine pigments, can be added to the composition for dyeing the composition and the layers produced therewith. Their amount generally ranges from about 1 to about 20% by weight, preferably from about 2 to about 15% by weight, and particularly preferred from about 2 to about 10% by weight related to the total weight of the non volatile components of the composition. Particularly suitable predispersed phthalocyanine pigments are disclosed in DE 199 15 717 and DE 199 33 139. Preference is given to metal-free phthalocyanine pigments.

In order to adjust the photopolymerizable composition to specific needs, thermal inhibitors or stabilizers for preventing thermal polymerization may be added. Furthermore, additional hydrogen donors, dyes, colored or colorless pigments, color formers, indicators, and plasticizers may be present. These additives are conveniently selected so that they absorb as little as possible in the actinic range of the imagewise applied radiation.

In a preferred embodiment of the present invention, the composition is photopolymerizable upon absorption of light in the wavelength range from about 300 nm to about 600 nm, preferably about 350 nm to about 430 nm, in particular from about 380 nm to about 430 nm, and particularly preferred from about 390 nm to about 420 nm.

The present invention also relates to a photopolymer printing plate precursor including the photopolymerizable composition on a support, in particular a photopolymer printing plate precursor including, in this order, the photopolymerizable composition and a protective coating on a support.

In a preferred embodiment of the present invention, the protective layer has a dry coating weight of less than about 2.0 g/m$^2$.

The photopolymerizable composition may be applied to the support by processes which are known per se to the person skilled in the art. In general, the components of the photopolymerizable composition are dissolved or dispersed in an organic solvent or solvent mixture, the solution or dispersion is applied to the intended support by pouring on, spraying on, immersion, roll application or in a similar process and the solvents are removed during the subsequent drying.

The known supports can be used for the photopolymer printing plate, like e.g., foils, tapes or plates made of metal or plastics and in the case of screen-printing also of Perlon gauze. Preferred metals are aluminum, aluminum alloys, steel and zinc, aluminum, and aluminum alloys being particularly preferred. Preferred plastics are polyester and cellulose acetates, polyethyleneterephthalate (PET) being particularly preferred.

In most cases it is preferred to treat the surface of the support mechanically and/or chemically and/or electrochemically to optimally adjust the adherence between the support and the photosensitive coating and/or to reduce the reflection of the imagewise exposed radiation on the surface of the support (antihalation).

The most preferred support to be used is made of aluminum or an aluminum alloy, its surface is electrochemically roughened, thereafter anodized and optionally treated with a hydrophilizing agent like, e.g., poly(vinylphosphonic acid).

The protective overcoat preferably includes at least one type of poly(vinyl alcohol), in particular a poly(vinyl alcohol) wherein the mean degree of saponification is less than about 93 mol %.

The degree of saponification is related to the production of poly(vinyl alcohols). As the monomer of poly(vinyl alcohol), vinyl alcohol, is nonexistent, only indirect methods are available for the production of poly(vinyl alcohol). The most important manufacturing process for poly(vinyl alcohol) is the polymerization of vinyl esters or ethers, with subsequent saponification or transesterification. The preferred starting material for the poly (vinyl alcohol) is a vinyl alcohol esterified by a mono carboxylic acid, and in particular vinyl acetate, but derivatives of vinyl acetate, vinyl esters of di carboxylic acids, vinyl ethers and the like can also be used. The degree of saponification as defined for the present invention is the molar degree of hydrolysis irrespective of the process used for the hydrolysis. Pure poly(vinyl alcohol) has, e.g., a degree of saponification of 100 mol %, but commercial products often have a degree of saponification of 98 mol %. The poly(vinyl alcohols) may contain mainly 1,3-diol units, but may also contain small amounts of 1,2-diol units. In the partially saponified poly(vinyl alcohols) the ester or the ether group can be distributed statistically or blockwise. Preferred partially saponified poly(vinyl alcohols) have a viscosity of a 4% aqueous solution at 20° C. of about 4 to about 60 mPa·s, preferably of about 4 to about 20 mPa·s, and in particular of about 4 to about 10 mPa·s.

Poly(vinyl alcohols) preferred for the present invention are commercially available, e.g., under the tradename Mowiol. Those products are characterized by two appended numbers, meaning the viscosity and the degree of saponification. For example, Mowiol 8-88 or Mowiol 8/88 mean a poly(vinyl alcohol) having as 4% aqueous solution at 20° C. a viscosity of ca 8 mPa·s and a degree of saponification of 88 mol %. Although the use of only one type of poly(vinyl alcohol) is sufficient to achieve an advantage, it is preferred to use a mixture of two or more compounds, because this allows a more accurate adjustment and a better optimization of further properties of the printing plate precursor. Preferably poly(vinyl alcohols) differing in viscosity as defined above and/or in saponification degree are combined. Particularly preferred are mixture of poly(vinyl alcohols) that differ in viscosity of their 4% aqueous solutions at 20° C. for at least about 2 mPa·s or that differ in saponification degree for at least about 5 mol %. Most preferred are mixtures including at least 3 types of poly(vinyl alcohols), wherein at least two compounds differ in viscosity as defined above for at least about 2 mPa·s and at least two compounds differ in saponification degree for at least about 5 mol-%.

According to a preferred embodiment of the present invention, the overall mean saponification degree of all poly(vinyl alcohols) used in the protective layer has to be less than about 93 mol %. In a particular preferred embodiment of the present invention, the overall mean saponification degree ranges from about 71 mol % to less than about 93 mol %, and in particular from about 80 mol % to about 92.9 mol %.

As long as the mean overall saponification limit of about 93 mol % is not reached, one of the poly(vinyl alcohols) used in a mixture can have a mean saponification degree of more than about 93 mol %, and even up to about 100 mol %.

The overall mean saponification degree of the poly(vinyl alcohols) used in the protective overcoat of a printing plate precursor can be determined experimentally via $^{13}$C-NMR. To measure the $^{13}$C-NMR spectra, approximately 200 mg of the protective overcoat are dissolved in 1.0 ml DMSO and from this solution a 75 MHz $^{13}$C-NMR spectrum is taken, whose resonances can easily be interpreted and allow to calculate the degree of saponification. Such values are listed in the Examples, in Table 3, as experimental values. A good correlation is obtained between the experimental values and the values known from the product specification of the poly (vinyl alcohols). The latter values are hereinafter called theoretical values of the mean saponification degree and can easily be calculated, when a mixture of poly(vinyl alcohols) are used.

Preferably, poly(vinyl alcohol)s are used in 50 to 99.9 weight percent (wt. %) relative to the total weight of the non-volatile compounds of the protective overcoat.

Apart from poly(vinyl alcohol)s, other water soluble polymers can be added to the layer such as poly(vinyl pyrrolidone), poly(ethylene oxide), gelatin, gum arabic, oxygen binding polymers with aliphatic amine groups known from EP 352 630 B1, methyl vinylether/maleic anhydride copolymers, poly(carboxylic acids), copolymers of ethylene oxide and poly(vinyl alcohol), carbon hydrates, hydroxy ethyl cellulose, acidic cellulose, cellulose, poly(arylic acid) and mixtures of these polymers.

Preferably, the poly(vinyl pyrrolidone) is only used in small quantities compared to the poly(vinyl alcohol). In a preferred embodiment of the present invention, poly(vinyl pyrrolidone) is used from 0 to 10 parts by weight of the poly(vinyl alcohol) used, from 0 to 3 parts by weight being particularly preferred. Most preferred, no poly(vinyl pyrrolidone) compounds are used.

In addition to the poly(vinyl alcohol) and the optional watersoluble polymers disclosed above, the known ingredients of protective layers can be used.

Examples of known ingredients suitable for the protective layer of the present invention are surface wetting agents, coloring agents, complexants, polyethylenimines, and biocides.

The protective layer has to be transparent for actinic light. Preferably it is homogeneous, substantially impermeable to oxygen, waterpermeable, and can be washed off preferably with the conventional developer solutions used to form a printing relief after imagewise exposure of the photosensitive layer. The photosensitive layer is removed imagewise, whereas the protective layer is removable over the entire area of the element created. The wash-off of the protective layer can be done in a separate step, but can be done during the development step as well.

The dry coating weight of the protective overcoat can be measured by the following procedure. A plate is exposed for 4 hours to daylight. Next the plate is pre-heated between 104° C. and 127° C. (temperature measured via a thermostrip (THERMAX commercially available from TMC) at the back of the plate). The plate is cut to a size of 100 mm×100 mm and weighted on an analytical balance with 0.01 mg accuracy (=Weight A). Next the protective overcoat is washed off with water (25° C.) for 2 minutes. Than the plate is rinsed with demineralized water and dried in an oven at 100° C. After drying the plate is allowed to cool down to room temperature, and the weight is determined using the same analytical balance as described earlier (=Weight B). The dry coating weight in g/m² of the protective overcoat is calculated using the formula below:

Dry coating weight (g/m$^2$)=100×(Weight $A$–Weight $B$)

The protective layer can be coated on the photosensitive layer with known techniques and the coating solution preferably contains water or a mixture of water and an organic solvent. To allow a better wetting, the coating solution preferably contains, related to the solid content, up to about 10 wt. %, and particularly preferred up to about 5 wt. % of a surface active agent. Suitable representatives of surface active agents include anionic, cationic, and nonionic surface active agents like sodium alkylsulfates and -sulfonates having 12 to 18 carbon atoms, an example of which is sodium dodecylsulfate, N-cetyl- and C-cetyl betaine, alkylaminocarboxylate and -dicarboxylate, and polyethylene glycols with a mean molar weight up to 400.

In addition, further functions can be added to the protective layer. For example, it can be possible to improve the safelight suitability without decreasing the sensitivity of the layer by adding a coloring agent, e.g., a water-soluble dye, that has excellent transmission to the light having a wavelength of about 300 nm to about 450 nm and that absorbs the light having a wavelength of about 500 nm or more. This principle can easily be varied for different wavelengths to adjust the effective spectral sensitivity distribution of the printing plate precursor as needed.

The present invention also relates to a method of making a lithographic printing plate including the steps of providing a photopolymer printing plate, exposing the printing plate precursor with a laser, preferably with a laser having an emission wavelength in the range from about 300 nm to about 600 nm, in particular from about 300 nm to about 450 nm, heating the plate to a temperature, when measured at the back of the plate, of about 90° C. to about 150° C., for a time between 10 seconds and 1 minute, washing off the protective coating and processing the printing plate precursor in an aqueous alkaline developer.

In preferred embodiment of the process of the present invention, the exposure is done with a laser having an emission wavelength in the range from about 380 nm to about 430 nm, in particular in the range from about 390 nm to about 420 nm, and the exposure is carried out at an energy density, measured on the surface of the plate, of about 100 µJ/cm² or less.

The processing of the printing plate precursor is done in the usual manner. After image-wise exposure, a pre-heat step is performed to improve the crosslinking of the photosensitive layer. Usually the pre-heat step is then followed by the development step, wherein the complete overcoat layer and the unexposed portion of the photosensitive layer are removed. The removal (wash-off) of the overcoat layer and the development of the photosensitive layer can be done in two separate steps in this order, but can also be done in one step simultaneously. Preferably, the overcoat layer is washed-off with water before the development step. The wash-off can be done with cold water, but it is preferred to use hot water to accelerate the process. What remains on the support after the development step are the exposed and thereby photopolymerized portions of the photosensitive layer. The developer solution used for the development of the exposed printing plate precursors is preferably an aqueous alkaline solution having a pH of at least 11, a pH from 11.5 to 13.5 being particularly preferred. The developer solution can contain a small percentage, preferably less than about 5 wt. %, of an organic, water-miscible solvent. To adjust the pH of the solution, an alkali hydroxide is preferably used.

Examples of preferred, additional ingredients of the developer solution include, alone or in combination, alkali phosphates, alkali carbonates, alkali bicarbonates, an organic amine compound, alkali silicates, buffering agents, complexants, defoamers, surface active agents, and dyes, but the suitable ingredients are not limited to the preferred examples and further ingredients can be used.

The method of development employed is not particularly limited, and may be conducted by soaking and shaking the plate in a developer, physically removing non-image portions while being dissolved in a developer by means of, e.g., a brush, or spraying a developer onto the plate so as to remove non-image portions. The time for development is selected depending upon the above method used so that the non-image portions can adequately by removed, and is optionally selected within a range of 5 seconds to 10 minutes.

After the development, the plate may be subjected to a hydrophilic treatment by means of, e.g., gum arabic optionally applied to the printing plate as the case requires (gumming step).

EXAMPLES

A. Preparation (Coating) of the Photosensitive Layer

A composition was prepared (pw=parts per weight; wt. %=weight percentage) by mixing the components as specified in table 1. A composition such as this was divided equally into portions of 26.21 g, and to each portion was added an amount of co-initiator according to table 2. The resulting composition was coated on an electrochemically roughened and anodically oxidized aluminum sheet, the surface of which has been rendered hydrophilic by treatment with an aqueous solution of polyvinyl phosphonic acid (oxide weight 3 g/m$^2$) and was dried for 1 minute at 120° C. (circulation oven). The resulting thickness of the layer was 1.5 g/m$^2$.

For each composition (experiment), two coatings were made.

TABLE 1

| Component | Parts per weight (g) |
|---|---|
| a solution containing 32.4 wt. % of a methacrylate/methacrylic acid copolymer (ratio methylmethacrylate: methacrylic acid of 4:1 by weight; acid number: 110 mg KOH/g) in 2-butanone (viscosity 105 mm$^2$/s at 25° C.). | 16.075 |

TABLE 1-continued

| Component | Parts per weight (g) |
|---|---|
| a solution containing 88.2 wt. % of a reaction product from 1 mole of 2,2,4-trimethyl-hexamethylenediisocyanate and 2 moles of hydroxy-ethylmethacrylate (viscosity 3.30 mm$^2$/s at 25° C.) | 14.538 |
| Heliogene blue D 7490 ® dispersion (9.9 wt. %, viscosity 7.0 mm$^2$/s at 25° C.), trade name of BASF AG | 17.900 |
| 2,2'-bis(2-chlorophenyl)-4,4',5,5'-tetraphenyl-1,2-bisimidazole | 1.448 |
| 1,4-di[3,5-dimethoxy-4-(1-methylpropoxy)styryl]benzene | 0.958 |
| Edaplan LA 411 ® (1% in Dowanol PM ®, trade mark of Dow Chemical Company) | 2.250 |
| 2-butanone | 78.538 |
| propyleneglycol-monomethylether (Dowanol PM ®, trade mark of Dow Chemical Company) | 130.358 |

TABLE 2

| Example | Experiment | Co-initiator | Amount Coinitiator (g) | Amount Coinitiator (mmol) |
|---|---|---|---|---|
| 1 | A | TH-1 | 0.0010 | 0.00598 |
| 1 | B | TH-1 | 0.0020 | 0.0120 |
| 1 | C | TH-1 | 0.0040 | 0.0239 |
| 1 | D | TH-1 | 0.0068 | 0.0407 |
| 1 | E | TH-1 | 0.0100 | 0.0598 |
| 1 | F | TH-1 | 0.0150 | 0.0897 |
| 1 | G | TH-1 | 0.0300 | 0.179 |
| 1 | H | TH-1 | 0.0500 | 0.299 |
| 1 | I | TH-1 | 0.1000 | 0.598 |
| 2 | J | TH-1 | 0.0068 | 0.0407 |
| 2 | K | III-1 | 0.0796 | 0.284 |
| 2 | L | TH-3 | 0.0796 | 0.452 |
| 2 | M | TH-2 | 0.0061 | 0.0403 |
| 2 | N | TH-2 | 0.0068 | 0.0450 |
| 2 | O | III-2 | 0.0796 | 0.163 |
| 2 | P | III-2 | 0.1592 | 0.326 |

On top of the photosensitive layer a solution in water with the composition as defined in Table 3 was coated and was dried at 110° C. for 2 minutes.

TH-1 means mercaptobenzthiazole (MBT) and

TH-2 means mercaptobenzoxazole (MBO).

TH-3 means Neopentylalcohol mono(3-mercaptopropionate)

TABLE 3

| Component | Parts by Weight (g) |
|---|---|
| partially hydrolyzed polyvinylalcohol (degree of hydrolysis 88%, viscosity 4 mPa · s in a solution of 4 wt. % at 20° C.). | 17.03 |
| partially hydrolyzed polyvinylalcohol (degree of hydrolysis 88%, viscosity 8 mPa · s in a solution of 4 wt. % at 20° C.). | 7.43 |
| fully hydrolyzed polyvinylalcohol (degree of hydrolysis 98%, viscosity 6 mPa · s in a solution of 4 wt. % at 20° C.). | 14.87 |
| CA 24 E | 0.26 |
| Metolat FC 355 | 0.38 |
| Lutensol A8 (90%) | 0.032 |
| Water | 960 |

The so formed protective overcoat had a dry thickness of 2.0 g/m².

The imaging was carried out with an experimental violet plate setter device (flat bed system) equipped with a violet laser diode emitting between about 392 nm and about 417 nm. The following imaging conditions were used:

Scanning speed: 1000 m/sec
Variable image plane power: 0 to 10.5 mW
Spot diameter: 20 µm
Addressability: 1270 dpi
Fixed laser energy setting of 86 µJ/cm²

After imaging the plate was processed in an Agfa VSP85 processor at a speed of 1.2 m/min. During the processing the plate was first heated (pre-heat step), next the protective overcoat was washed off and the photolayer was processed in a water based alkaline developer (Agfa PD91) at 28° C. After water rinsing and gumming step the printing plate was ready. A 13-step exposure wedge with density increments of 0.15 was used to determine the sensitivity of the plate.

The results of the exposure tests are shown in Table 4 as the sum of the density of the UGRA step wedges measured by a Gretag Macbeth D19C densitometer (cyan setting). One fully hardened step=1.00. Higher values indicate higher sensitivity of the plate.

In the table is given for every experiment (composition) the mean value measured for two plates that were separately coated, and therefore a highly reliable value. By this experimental procedure were eliminated variations in results due to slight differences in temperature during exposure, laser power, brush pressure in developing bath and human error in making of stock solutions and coatings. In experiment 2 the value for composition J is the mean value from 6 plates, to have a very reliable reference point.

TABLE 4

| Example | Experiment | Coinitiator | UGRA Sum mean value | |
|---------|------------|-------------|---------------------|---|
| 1 | A | TH-1 | 0.06 | comparison |
| 1 | B | TH-1 | 1.93 | comparison |
| 1 | C | TH-1 | 3.05 | comparison |
| 1 | D | TH-1 | 3.92 | comparison |
| 1 | E | TH-1 | 4.00 | comparison |
| 1 | F | TH-1 | 4.12 | comparison |
| 1 | G | TH-1 | 4.06 | comparison |
| 1 | H | TH-1 | 3.86 | comparison |
| 1 | I | TH-1 | 3.31 | comparison |
| 2 | J | TH-1 | 3.86 | comparison |
| 2 | K | III-1 | 4.48 | invention |
| 2 | L | TH-3 | no image | comparison |
| 2 | M | TH-2 | 3.33 | comparison |
| 2 | N | TH-2 | 3.89 | comparison |
| 2 | O | III-2 | 4.60 | invention |
| 2 | P | III-2 | 4.23 | invention |

The absolute sensitivity for all examples of the present invention was higher than about 100 µJ/cm² (lower numerical values). To illustrate, an UGRA sum of 3.86 for experiment J corresponds to a sensitivity of about 68 µJ/cm². It can be clearly seen that the multi-functional thiol co-initiators give rise to plates with a higher sensitivity than standard mono-functional co-initiators such as mercaptobenzthiazole (TH-1) or mercaptobenzoxazole (TH-2). Comparison of III-1 with TH-3 also surprisingly shows that an SH functionality of more than 1 is essential for this type of compounds. Experiments A to I show that varying the concentration of (TH-1) in the photolayer over a wide range does not lead to sensitivity as high as plates containing the multi-functional thiols. For each multi-functional thiol of the preferred embodiments of the present invention, an optimum concentration in the photolayer can be found by common optimization experiments.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A photopolymer printing plate precursor comprising:
a photopolymerizable composition on a support, the photopolymerizable composition comprising:
a binder, a polymerizable compound, a sensitizer, a photoinitiator, and a polythiol compound, wherein the composition includes, with respect to its total solid weight, from about 0.01 wt. % to about 5 wt. % of the polythiol compound and the polythiol compound is selected from one of the following formulae (IIIa) or (IIIb):

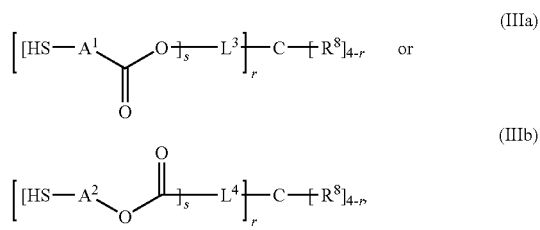

wherein
$R^8$ mutually independent means H or a non-metal atom substituent;
$A^1, A^2$ mutually independent mean a linear alkyl chain with at most 16 carbon atoms;
$L^3, L^4$ mutually independent mean linking groups or single bonds;
s means an integer from 1 to 100;
r means 1, 2, 3 or 4;
the product of s times r is at least 2;
the thiol groups of formulae (IIIa) or (IIIb) may also be present in their tautomeric thione form;
the composition, when coated on a support, has a sensitivity of about 150 µJ/cm² or higher; and
for polythioles of formula (IIIa), $R^8$ means hydrogen, methyl, or ethyl; and r means 1, 2, or 3.

2. The photopolymer printing plate precursor according to claim 1, wherein $L^3, L^4$ mutually independent mean alkylene, alkyleneoxy or polyglycerol; or alkylene chain containing acyloxy, ether, carbonate, thioether, hydroxy, phenyl, heterocylic, amino, thiol, sulphonyl, amido, urethane, or urea functions.

3. The photopolymer printing plate precursor according to claim 1, wherein R8 means hydrogen, methyl, or ethyl; s means 1; $L^3, L^4$ mean alkylene; and r means 2.

4. The photopolymer printing plate precursor according to claim 1, wherein the photoinitiator is a hexaaryl-bisimidazole compound.

5. The photopolymer printing plate precursor according to claim 3, wherein the photoinitiator is a hexaaryl-bisimidazole compound.

6. The photopolymer printing plate precursor according to claim 1, further comprising a further sulfur containing compound as a chain transfer agent.

7. The photopolymer printing plate precursor according to claim 3, further comprising a further sulfur containing compound as a chain transfer agent.

8. The photopolymer printing plate precursor according to claim 5, further comprising a further sulfur containing compound as a chain transfer agent.

9. The photopolymer printing plate precursor according to claim 1, wherein a minimum exposure for image formation, measured on a surface of the plate surface, is about 100 µJ/cm$^2$ or less.

10. A method of making a lithographic printing plate comprising the steps of:
providing the photopolymer printing plate precursor as defined in claim 1;
exposing the printing plate precursor with a laser having an emission wavelength in the range from about 300 nm to 600 nm;
heating the plate to a temperature, when measured at the back of the plate, of about 90° C. to about 150° C. for a time between about 10 seconds and about 1 minute; and
processing the printing plate precursor in an aqueous alkaline developer.

11. The method according to claim 10, wherein the printing plate precursor is exposed with a laser having an emission wavelength in a range from about 380 nm to about 600 nm.

12. The method according to claim 10, wherein the exposure of the lithographic printing plate precursor is carried out at an energy density, measured on a surface of the plate, of about 100 µJ/cm$^2$ or less.

* * * * *